(12) United States Patent
Ikeda et al.

(10) Patent No.: US 11,858,856 B2
(45) Date of Patent: Jan. 2, 2024

(54) POLYCRYSTALLINE DIAMOND AND METHOD FOR MANUFACTURING SAME, SCRIBE TOOL, SCRIBE WHEEL, DRESSER, ROTATING TOOL, WIRE DRAWING DIE, CUTTING TOOL, ELECTRODE, AND PROCESSING METHOD USING POLYCRYSTALLINE DIAMOND

(71) Applicant: Sumitomo Electric Industries, Ltd., Osaka (JP)

(72) Inventors: Kazuhiro Ikeda, Itami (JP); Keiko Arimoto, Itami (JP); Katsuko Yamamoto, Itami (JP); Hitoshi Sumiya, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 1260 days.

(21) Appl. No.: 16/346,459

(22) PCT Filed: Nov. 29, 2017

(86) PCT No.: PCT/JP2017/042856
§ 371 (c)(1),
(2) Date: Apr. 30, 2019

(87) PCT Pub. No.: WO2018/101346
PCT Pub. Date: Jun. 7, 2018

(65) Prior Publication Data
US 2019/0300439 A1    Oct. 3, 2019

(30) Foreign Application Priority Data

Nov. 30, 2016  (JP) ................................. 2016-232355

(51) Int. Cl.
C04B 35/52    (2006.01)
B01J 3/06     (2006.01)
(Continued)

(52) U.S. Cl.
CPC ................ *C04B 35/52* (2013.01); *B01J 3/06* (2013.01); *B01J 3/062* (2013.01); *B23B 27/14* (2013.01);
(Continued)

(58) Field of Classification Search
CPC ....... C04B 35/52; C04B 35/528; C04B 41/87; C04B 2235/421; C04B 2235/427;
(Continued)

(56) References Cited

FOREIGN PATENT DOCUMENTS

EP      2738140 A1    6/2014
JP      7-299467 A   11/1995
(Continued)

OTHER PUBLICATIONS

Tachibana et al (Growth of Polycrystalline Diamond Films Including Diborane and Oxygen in the Source Gas, Journal of the Electrochemical Society, 1999) (Year: 1999).*
(Continued)

*Primary Examiner* — Colin W. Slifka
*Assistant Examiner* — Logan Edward Laclair
(74) *Attorney, Agent, or Firm* — McCarter & English, LLP; Michael A. Sartori

(57) ABSTRACT

Provided is polycrystalline diamond having a diamond single phase as basic composition, in which the polycrystalline diamond includes a plurality of crystal grains and contains boron, hydrogen, oxygen, and the remainder including carbon and trace impurities; the boron is dispersed in the crystal grains at an atomic level, and greater than or equal to 90 atomic % of the boron is present in an isolated substitutional type; hydrogen and oxygen are present in an isolated substitutional type or an interstitial type in the crystal grains; each of the crystal grains has a grain size of less than or equal to 500 nm; and the polycrystalline diamond has a surface covered with a protective film.

34 Claims, 6 Drawing Sheets

(51) Int. Cl.
| | | |
|---|---|---|
| *B23B 27/20* | (2006.01) | |
| *C04B 41/87* | (2006.01) | |
| *B23B 27/14* | (2006.01) | |
| *C01B 32/25* | (2017.01) | |
| *C23C 16/26* | (2006.01) | |
| *C01B 32/205* | (2017.01) | |
| *C30B 29/04* | (2006.01) | |
| *C04B 35/528* | (2006.01) | |
| *C25B 11/043* | (2021.01) | |

(52) U.S. Cl.
CPC .......... *B23B 27/20* (2013.01); *C01B 32/205* (2017.08); *C01B 32/25* (2017.08); *C04B 35/528* (2013.01); *C04B 41/87* (2013.01); *C23C 16/26* (2013.01); *C25B 11/043* (2021.01); *C30B 29/04* (2013.01); *B01J 2203/061* (2013.01); *B01J 2203/0655* (2013.01); *C04B 2235/421* (2013.01); *C04B 2235/427* (2013.01); *C04B 2235/781* (2013.01); *C04B 2235/963* (2013.01)

(58) Field of Classification Search
CPC .......... C04B 2235/781; C04B 2235/963; B01J 3/06; B01J 3/062; B01J 2203/061; B01J 2203/0655; B23B 27/14; B23B 27/20; C01B 32/205; C01B 32/25; C01B 32/182; C01B 32/26; C23C 16/26; C25B 11/043; C30B 29/04

See application file for complete search history.

(56) References Cited

FOREIGN PATENT DOCUMENTS

| JP | 2012-106925 A | 6/2012 |
|---|---|---|
| JP | 2013-028500 A | 2/2013 |
| JP | 2015-030646 A | 2/2015 |

OTHER PUBLICATIONS

Hu et al (High mobility n-type conductive ultrananocrystalline diamond and graphene nanoribbon hybridized carbon films, Carbon, 2016) (Year: 2016).*

Notice of Allowance issued in U.S. Appl. No. 16/346,419 dated May 5, 2022.

Office Action issued in U.S. Appl. No. 16/346,419 dated Oct. 18, 2021.

Office Action issued in U.S. Appl. No. 16/346,419 dated May 19, 2021.

Tachibana, T. et al., "Growth of polycrystalline diamond films including diborane and oxygen in the source gas," Journal of the Electrochemical Society, 1999, 4 pages.

U.S. Appl. No. 16/346,419, filed Apr. 30, 2019 [Provided in IFW].

* cited by examiner

POLYCRYSTALLINE DIAMOND AND METHOD FOR MANUFACTURING SAME, SCRIBE TOOL, SCRIBE WHEEL, DRESSER, ROTATING TOOL, WIRE DRAWING DIE, CUTTING TOOL, ELECTRODE, AND PROCESSING METHOD USING POLYCRYSTALLINE DIAMOND

TECHNICAL FIELD

The present invention relates to polycrystalline diamond and a method for manufacturing the same. The present application claims priority to Japanese Patent Application No. 2016-232355 filed on Nov. 30, 2016 The contents disclosed in the Japanese application are all incorporated by reference herein in their entirety. The polycrystalline diamond according to the present invention is suitably used in a scribe tool, a scribe wheel, a dresser, a rotating tool, a wire drawing die, a cutting tool, an electrode, and the like. The present invention further relates to a processing method using polycrystalline diamond.

BACKGROUND ART

It has recently been clarified that nano polycrystalline diamond has a higher isotropic hardness than natural single-crystal diamond. Nano polycrystalline diamond to which conductivity has been imparted by adding a boron compound to such a material, and nano polycrystalline diamond in which boron atoms are substituted for carbon atoms in the diamond crystals, having semiconductor properties only with a diamond structure have been developed.

For example. Japanese Patent Laying-Open No 2012-106925 (PTL1) discloses a high-hardness conductive diamond polycrystalline body formed substantially with diamond alone, in which the diamond has a maximum particle size of less than or equal to 100 nm and an average particle size of less than or equal to 50 nm, and a particle of the diamond includes greater than or equal to 10 ppm and less than or equal to 1000 ppm of boron.

In addition, Japanese Patent Laying-Open No. 2013-28500 (PTL2) discloses polycrystalline diamond composed of carbon; a group III element added to be dispersed in the carbon at the atomic level; and inevitable impurities, the polycrystalline diamond having a crystal grain size less than or equal to 500 nm.

CITATION LIST

Patent Literature

PTL1: Japanese Patent Laying-Open No. 2012-106925
PTL2: Japanese Patent Laying-Open No. 2013-28500

SUMMARY OF INVENTION

The polycrystalline diamond according to an aspect of the present invention is polycrystalline diamond having a diamond single phase as basic composition, wherein the polycrystalline diamond includes a plurality of crystal grains, the polycrystalline diamond contains boron, hydrogen, oxygen, and a remainder including carbon and trace impurities; the boron is dispersed in the crystal grains at an atomic level, and greater than or equal to 90 atomic % of the boron is present in an isolated substitutional type; the hydrogen and the oxygen are present in an isolated substitutional type or an interstitial type in the crystal grains; each of the crystal grains has a grain size of less than or equal to 500 nm; and the polycrystalline diamond has a surface covered with a protective film.

A method for manufacturing polycrystalline diamond according to another aspect of the present invention includes a first step of preparing graphite containing carbon, boron, hydrogen, and oxygen, a second step of placing the graphite in a vessel under an inert gas atmosphere; and a third step of converting the graphite to diamond by pressure heat treatment in the vessel, wherein the boron is dispersed in a crystal grain of the graphite at an atomic level, and greater than or equal to 90 atomic % of the boron is present in an isolated substitutional type.

DETAILED DESCRIPTION

Figure 1:
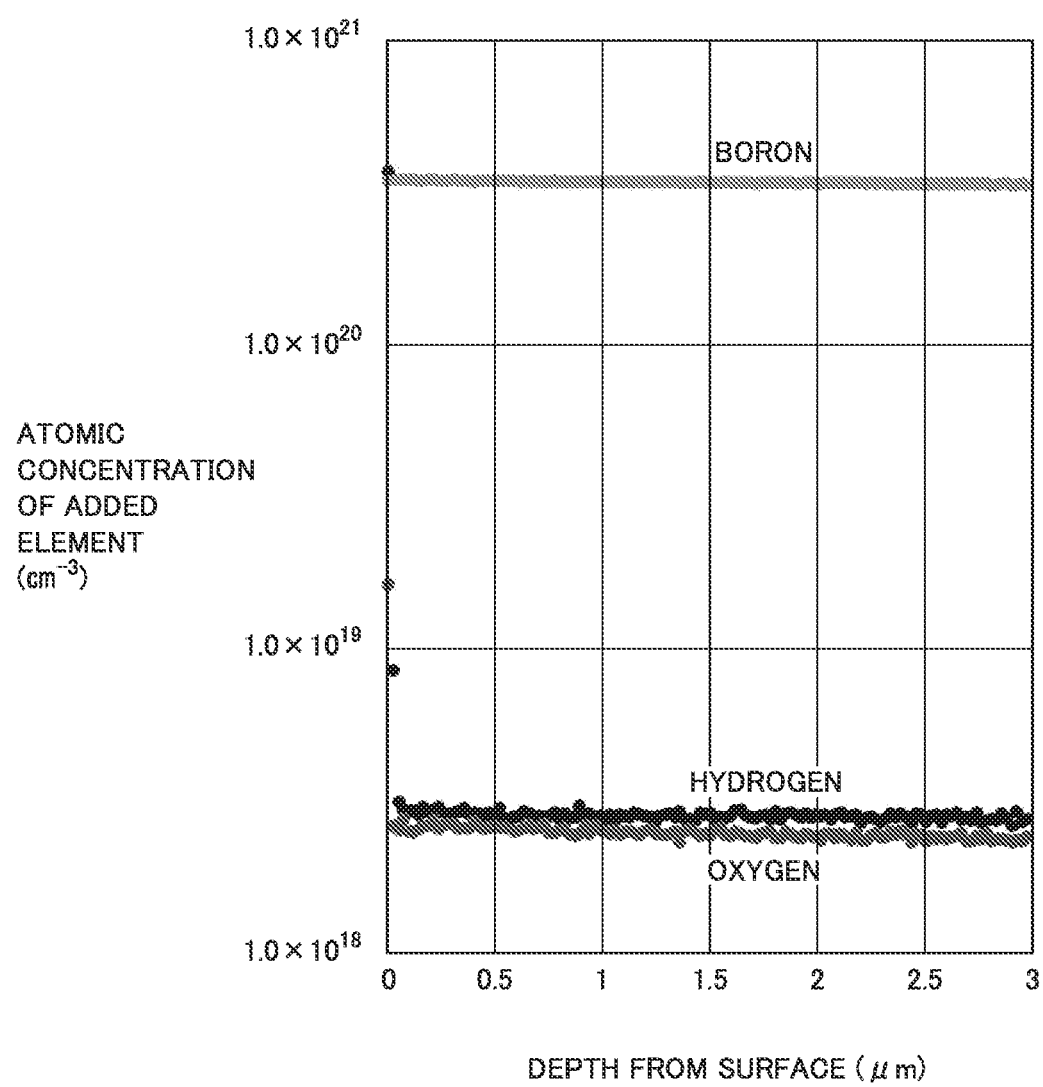
FIG. 1 is a graph showing an example of SIMS results of polycrystalline diamond according to an aspect of the present invention.

Problem to be Solved by the Present Disclosure

High-hardness conductive diamond polycrystalline body disclosed in Japanese Patent Laying-Open No. 2012-106925 (PTL1) contains boron as a boron compound in a diamond crystal, and thus, boron oxide is formed on a surface of diamond, so that oxidation resistance is improved. Such a boron compound, however, does not have a diamond structure, without high hardness like diamond, and has a thermal expansion coefficient different from that of diamond. Therefore, a problem may occur such as deterioration of wear resistance or occurrence of a crack at a high temperature.

Polycrystalline diamond disclosed in Japanese Patent Laying-Open No. 2013-28500 (PTL2) does not contain a boron compound because boron has been dispersed at the atomic level, so that occurrence of a crack or the like is suppressed. However, carbon exposed on the surface is subjected to oxidation, thereby being tuned into $CO_X$ gas to be consumed. Therefore, a problem may occur such as deterioration of wear resistance.

Then, in the polycrystalline diamond, boron is included in the diamond crystal at the atomic level and in an isolated substitutional type, and the surface of the diamond is also covered with a protective film which is an oxide film so as to solve the above-described problems. Thus, an object of the present invention is to provide polycrystalline diamond having high wear resistance and a method for manufacturing the same; a scribe tool, a scribe wheel, a dresser, a rotating tool, a wire drawing die, a cutting tool, and an electrode that are formed using the polycrystalline diamond; and a processing method using the polycrystalline diamond.

Advantageous Effect of the Present Disclosure

According to the above, in the polycrystalline diamond, boron is included in the diamond crystal at the atomic level and in an isolated substitutional type, and the surface of the diamond is covered with a protective film which is an oxide film so as to solve the above-described problems. Thus, polycrystalline diamond having high wear resistance and a method for manufacturing the same; a scribe tool, a scribe wheel a dresser, a rotating tool, a wire drawing die, a cutting tool, and an electrode that are formed using the polycrystalline diamond; and a processing method using the polycrystalline diamond can be provided.

Description of Embodiments

First, embodiments of the present invention will be listed and described.

[1] The polycrystalline diamond according to an embodiment of the present invention is polycrystalline diamond having a diamond single phase as basic composition, wherein the polycrystalline diamond includes a plurality of crystal grains; the polycrystalline diamond contains boron, hydrogen, oxygen, and a remainder including carbon and trace impurities; the boron is dispersed in the crystal grains at an atomic level, and greater than or equal to 90 atomic % of the boron is present in an isolated substitutional type, the hydrogen and the oxygen are present in an isolated substitutional type or an interstitial type in the crystal grains; each of the crystal grains has a grain size of less than or equal to 500 nm; and the polycrystalline diamond has a surface covered with a protective film.

The boron is dispersed in the crystal grains of the polycrystalline diamond at an atomic level, greater than or equal to 90 atomic % of the boron is present in an isolated substitutional type, and the hydrogen and the oxygen are also present in an isolated substitutional type or an interstitial type in the crystal grains, so that the polycrystalline diamond according to the present embodiment maintains a high-hardness diamond structure in the inner portion thereof, and the carbon, the boron, the hydrogen, and the oxygen exposed on the surface of the polycrystalline diamond form an oxide film, and the oxide film covers the surface of the polycrystalline diamond as a protective film. Therefore, the oxidation resistance of the polycrystalline diamond increases and the coefficient of friction is reduced, which in turn improves sliding properties and wear resistance.

[2] In the polycrystalline diamond according to the present embodiment, greater than or equal to 99 atomic % of the boron can be present in an isolated substitutional type in the crystal grains. The polycrystalline diamond more easily maintains the high-hardness diamond structure in the inner portion thereof.

[3] In the polycrystalline diamond according to the present embodiment, the boron can have an atomic concentration of greater than or equal to $1 \times 10^{14}$ cm$^{-3}$ and less than or equal to $1 \times 10^{22}$ cm$^{-3}$. Since the polycrystalline diamond has a boron concentration of greater than or equal to $1 \times 10^{14}$ cm$^{-3}$ and less than or equal to $1 \times 10^{22}$ cm$^{-3}$, a suitable protective film is formed on its surface.

[4] In the polycrystalline diamond according to the present embodiment, the hydrogen can have an atomic concentration of greater than or equal to $1 \times 10^{17}$ cm$^{-3}$ and less than or equal to $1 \times 10^{20}$ cm$^{-3}$. The polycrystalline diamond has a hydrogen concentration of greater than or equal to $1 \times 10^{17}$ cm$^{-3}$ and less than or equal to $1 \times 10^{20}$ cm$^{-3}$, oxygen can be stably contained in the crystal and deterioration of hardness can be suppressed.

[5] In the polycrystalline diamond according to the present embodiment, the oxygen can have an atomic concentration of greater than or equal to $1 \times 10^{17}$ cm$^{-3}$ and less than or equal to $1 \times 10^{20}$ cm$^{-3}$. Since the polycrystalline diamond has an oxygen concentration of greater than or equal to $1 \times 10^{17}$ cm$^{-3}$ and less than or equal to $1 \times 10^{20}$ cm$^{-3}$, the formation of the protective film, which is an oxide film, on the surface thereof is accelerated, so that oxidation resistance is improved, the coefficient of friction is reduced, and deterioration of hardness can also be suppressed.

[6] In a Raman spectroscopic measurement of the polycrystalline diamond according to the present embodiment, a peak area around 1575 cm$^{-1}$±30 cm$^{-1}$ with a half width of greater than 10 cm$^{-1}$ and less than or equal to 20 cm$^{-1}$ can be less than 1% of a peak area around 1300 cm$^{-1}$±30 cm$^{-1}$ with a half width of less than or equal to 60 cm$^{-1}$. Since a peak area derived from amorphous carbon or graphite carbon (SP2 carbon) around 1575 cm$^{-1}$±30 cm$^{-1}$ with a half width of less than or equal to 20 cm$^{-1}$ is less than 1% of a peak area derived from diamond carbon (SP3 carbon) around 1300 cm$^{-1}$±30 cm$^{-1}$ with a half width of less than or equal to 60 cm$^{-1}$, the graphite carbon is substantially completely (specifically, greater than or equal to 99 atomic %) converted to diamond carbon, so that the polycrystalline diamond has high hardness.

[7] The surface (the surface covered with the protective film) of the polycrystalline diamond according to the present embodiment can have a dynamic friction coefficient of less than or equal to 0.06. Since the surface thereof has a low dynamic friction coefficient of less than or equal to 0.06, the polycrystalline diamond has high sliding properties and high wear resistance.

[8] The surface (the surface covered with the protective film) of the polycrystalline diamond according to the present embodiment can have a dynamic friction coefficient of less than or equal to 0.05. Since the surface thereof has a low dynamic friction coefficient of less than or equal to 0.05, the polycrystalline diamond has high sliding properties and high wear resistance.

[9] In the polycrystalline diamond according to the present embodiment, the protective film can contain a $BO_X$ cluster, and at least one of O and OH that are an oxygen end of the carbon. It is considered that the $BO_X$ cluster is formed by allowing B (boron) exposed on the surface to react with oxygen in the air and oxygen in the crystal grains (oxygen in the crystal grains in vacuo or in an inert gas) and that O and OH that are an oxygen end of the carbon are formed by allowing the carbon exposed on the surface to react with oxygen in the air and oxygen in the crystal grains (oxygen in the crystal grains in vacuo or in an inert gas). These elements have high slidability and a low coefficient of friction, so that wear resistance is improved.

[10] In the polycrystalline diamond according to the present embodiment, the protective film can contain a precipitate precipitated out of the crystal grains. In addition to the $BO_X$ cluster and at least one of O and OH that are an oxygen end of the carbon, the protective film further contains the precipitate having high slidability and a low coefficient of friction, so that the wear resistance of the polycrystalline diamond is improved.

[11] In the polycrystalline diamond according to the present embodiment, the protective film has an average film thickness of greater than or equal to 1 nm and less than or equal to 1000 nm. Because of the protective film having an average film thickness of greater than or equal to 1 nm and less than or equal to 1000 nm, even though the surface of the polycrystalline diamond is chipped due to mechanical damage to the polycrystalline diamond, the chipped portion is filled with the protective film in a portion other than the chipped portion, so that the polycrystalline diamond maintains a smooth surface.

[12] The polycrystalline diamond can contain a graphene nanoribbon.

Accordingly, a graphene nanoribbon-derived protective film can be formed on the surface thereof.

[13] The polycrystalline diamond can have a peak at a Raman shift of $1554 \text{ cm}^{-1} \pm 20 \text{ cm}^{-1}$ with a half width of less than or equal to $10 \text{ cm}^{-1}$ in the Raman spectroscopic measurement. Accordingly, a graphene nanoribbon-derived protective film can be formed on the surface thereof.

[14] The polycrystalline diamond can have a peak at a Raman shift of $2330 \text{ cm}^{-1} \pm 20 \text{ cm}^{-1}$ with a half width of less than or equal to $6 \text{ cm}^{-1}$ in the Raman spectroscopic measurement. Accordingly, a graphene nanoribbon-derived protective film can be formed on the surface thereof.

[15] Specifically, the polycrystalline diamond according to the present embodiment is polycrystalline diamond having a diamond single phase as basic composition, wherein the polycrystalline diamond includes a plurality of crystal grains; the polycrystalline diamond contains boron, hydrogen, oxygen, and a remainder including carbon and trace impurities; the boron is dispersed in the crystal grains at an atomic level, and greater than or equal to 90 atomic % of the boron is present in an isolated substitutional type; the hydrogen and the oxygen are present in an isolated substitutional type or an interstitial type in the crystal grains; each of the crystal grains has a grain size of less than or equal to 500 nm; the polycrystalline diamond has a surface covered with a protective film; the boron has an atomic concentration of greater than or equal to $1 \times 10^{14} \text{ cm}^{-3}$ and less than or equal to $1 \times 10^{22} \text{ cm}^{-3}$; the hydrogen has an atomic concentration of greater than or equal to $1 \times 10^{17} \text{ cm}^{-3}$ and less than or equal to $1 \times 10^{20} \text{ cm}^{-3}$; the oxygen has an atomic concentration of greater than or equal to $1 \times 10^{17} \text{ cm}^{-3}$ and less than or equal to $1 \times 10^{20} \text{ cm}^{-3}$; in a Raman spectroscopic measurement of the polycrystalline diamond, a peak area around $1575 \text{ cm}^{-1} \pm 30 \text{ cm}^{-1}$ with a half width of greater than $10 \text{ cm}^{-1}$ and less than or equal to $20 \text{ cm}^{-1}$ is less than 1% of a peak area around $1300 \text{ cm}^{-1} \pm 30 \text{ cm}^{-1}$ with a half width of less than or equal to $60 \text{ cm}^{-1}$; the surface (the surface covered with the protective film) of the polycrystalline diamond has a dynamic friction coefficient of less than or equal to 0.05; the protective film contains a $BO_X$ cluster, at least one of O and OH that are an oxygen end of the carbon, and a precipitate precipitated out of the crystal grains; the protective film has an average film thickness of greater than or equal to 1 nm and less than or equal to 1000 nm; the polycrystalline diamond contains a graphene nanoribbon; the polycrystalline diamond has a peak at a Raman shift of $1554 \text{ cm}^{-1} \pm 20$ $\text{cm}^{-1}$ with a half width of less than or equal to $10 \text{ cm}^{-1}$ in the Raman spectroscopic measurement; and the polycrystalline diamond has a peak at a Raman shift of $2330 \text{ cm}^{-1} \pm 20 \text{ cm}^{-1}$ with a half width of less than or equal to $6 \text{ cm}^{-1}$ in the Raman spectroscopic measurement. Since the polycrystalline diamond has the above-described characteristics, the oxidation resistance thereof increases and the dynamic friction coefficient is reduced, which in turn improves sliding properties and wear resistance.

[16] A method for manufacturing polycrystalline diamond according to another embodiment of the present invention includes a first step of preparing graphite containing carbon, boron, hydrogen, and oxygen; a second step of placing the graphite in a vessel under an inert gas atmosphere; and a third step of converting the graphite to diamond by pressure heat treatment in the vessel, wherein the boron is dispersed in a crystal grain of the graphite at an atomic level, and greater than or equal to 90 atomic % of the boron is present in an isolated substitutional type.

In the method for manufacturing polycrystalline diamond according to another embodiment of the present invention, since the graphite is directly converted to diamond, polycrystalline diamond of the above embodiment having high oxidation resistance, a low dynamic friction coefficient, high sliding properties, and high wear resistance (i.e., polycrystalline diamond containing boron, hydrogen, and oxygen, in which the boron is dispersed in the crystal grains at the atomic level, and greater than or equal to 90 atomic % of the boron is present in an isolated substitutional type; and the hydrogen and the oxygen are present in an isolated substitutional type or an interstitial type in the crystal grains) can be manufactured.

[17] In the method for manufacturing polycrystalline diamond according to the present embodiment, the first step includes a sub-step of forming a graphite base material containing carbon and boron on a base material by a vapor phase method, and the boron is dispersed in a crystal grain of the graphite base material at an atomic level, and greater than or equal to 90 atomic % of the boron is present in an isolated substitutional type. According to the method for manufacturing polycrystalline diamond, the graphite base material can be suitably produced by the vapor phase method.

[18] In the method for manufacturing polycrystalline diamond according to the present embodiment, the first step can further include a sub-step of including the hydrogen and the oxygen in the graphite base material by a vapor phase method.

According to the method for manufacturing polycrystalline diamond, the graphite can be suitably produced by including the hydrogen and the oxygen in the graphite base material by the vapor phase method.

[1] In the method for manufacturing polycrystalline diamond according to the present embodiment, the first step can further include a sub-step of including the hydrogen and the oxygen in the graphite base material under vacuum condition.

According to the method for manufacturing polycrystalline diamond, the graphite can be suitably produced by including the hydrogen and the oxygen in the graphite base material under vacuum condition.

[20] In the method for manufacturing polycrystalline diamond according to the present embodiment, the first step can include a step of forming the graphite on a base material by simultaneously mixing the carbon, the boron, the hydrogen, and the oxygen with one another in vapor phase by a vapor phase method. According to the method for manufacturing polycrystalline diamond, the graphite can be suitably produced by simultaneously mixing the carbon, the boron, the hydrogen, and the oxygen with one another in vapor phase by the vapor phase method, and then allowing these elements to react with one another.

[21] In the method for manufacturing polycrystalline diamond according to the present embodiment, the first step can include a sub-step of forming a gas mixture containing the carbon, the boron, the hydrogen, and the oxygen; and a sub-step of forming the graphite on the base material by thermally decomposing the gas mixture at a temperature of greater than or equal to 1500° C. and feeding the gas mixture toward the base material, and the gas mixture can include a gas containing the boron, the hydrogen, and the oxygen, and a hydrocarbon gas. According to the method for manufacturing polycrystalline diamond, the graphite can be suitably produced in good yield by feeding the gas mixture including the hydrocarbon gas containing the carbon, and the gas containing the boron, the hydrogen, and the oxygen toward the base material.

[22] In the method for manufacturing polycrystalline diamond according to the present embodiment, the hydrocarbon gas can be a methane gas. According to the method for manufacturing polycrystalline diamond, the graphite of the above embodiments can be suitably produced by using a methane gas as the hydrocarbon gas.

[23] In the method for manufacturing polycrystalline diamond according to the present embodiment, in the third step, the graphite can be directly subjected to pressure heat treatment in a pressure heat treatment apparatus. According to the method for manufacturing polycrystalline diamond, the polycrystalline diamond of the above embodiment can be suitably manufactured by directly subjecting the graphite to pressure heat treatment in the pressure heat treatment apparatus.

[24] In the method for manufacturing polycrystalline diamond according to the present embodiment, the pressure heat treatment can be performed under conditions of greater than or equal to 6 GPa and greater than or equal to 1200° C. According to the method for manufacturing polycrystalline diamond, the polycrystalline diamond of the above embodiment can be suitably manufactured by performing pressure heat treatment under conditions of greater than or equal to 6 GPa and greater than or equal to 1200° C.

[25] In the method for manufacturing polycrystalline diamond according to the present embodiment, the pressure heat treatment can be performed under conditions of greater than or equal to 8 GPa and less than or equal to 30 GPa, and greater than or equal to 1200° C. and less than or equal to 2300° C. According to the method for manufacturing polycrystalline diamond, the polycrystalline diamond of the above embodiment can be suitably manufactured by performing pressure heat treatment under conditions of greater than or equal to 8 GPa and less than or equal to 30 GPa, and greater than or equal to 1200° C. and less than or equal to 2300° C.

[26] The scribe tool according to still another embodiment of the present invention can be formed using the polycrystalline diamond of the above embodiment. The scribe tool according to the present embodiment has high wear resistance because it is formed using the polycrystalline diamond of the above embodiment.

[27] The scribe wheel according to still another embodiment of the present invention can be formed using the polycrystalline diamond of the above embodiment.

The scribe wheel according to the present embodiment has high wear resistance because it is formed using the polycrystalline diamond of the above embodiment.

[28] The dresser according to still another embodiment of the present invention can be formed using the polycrystalline diamond of the above embodiment. The dresser according to the present embodiment has high wear resistance because it is formed using the polycrystalline diamond of the above embodiment.

[29] The rotating tool according to still another embodiment of the present invention can be formed using the polycrystalline diamond of the above embodiment. The rotating tool according to the present embodiment has high wear resistance because it is formed using the polycrystalline diamond of the above embodiment.

[30] The wire drawing die according to still another embodiment of the present invention can be formed using the polycrystalline diamond of the above embodiment. The wire drawing die according to the present embodiment has high wear resistance because it is formed using the polycrystalline diamond of the above embodiment.

[31] The cutting tool according to still another embodiment of the present invention can be formed using the polycrystalline diamond of the above embodiment. The cutting tool according to the present embodiment has high wear resistance because it is formed using the polycrystalline diamond of the above embodiment.

[32] The electrode according to still another embodiment of the present invention can be formed using the polycrystalline diamond of the above embodiment. The electrode according to the present embodiment has high wear resistance because it is formed using the polycrystalline diamond of the above embodiment.

[33] In the processing method according to still another embodiment of the present invention, an object can be processed using the polycrystalline diamond of the above embodiment. In the processing method according to the present embodiment, the object can be efficiently processed at low cost because it is processed using the polycrystalline diamond of the above embodiment.

[34] In the processing method according to still another embodiment of the present invention, the object can be an insulator. In the processing method according to the present embodiment, the object is processed using the polycrystalline diamond of the above embodiment having conductivity. Therefore, even though the object is an insulator, it can be efficiently processed at low cost without generating abnormal wear and tear caused by triboplasma or the like.

[35] In the processing method according to still another embodiment of the present invention, the insulator as the object can have a resistivity of greater than or equal to 100 kΩ·cm. In the processing method according to the present embodiment, the object is processed using the polycrystalline diamond of the above embodiment having conductivity. Therefore, even though the object is an insulator having a resistivity of greater than or equal to 100 kΩ·cm, the object can be efficiently processed at low cost without etching caused by triboplasma.

DETAILS OF EMBODIMENTS OF INVENTION

Embodiments according to the present invention will be described in further detail below. Here, the notation "A to B" in this specification means upper and lower limits of the range (i.e., greater than or equal to A and less than or equal to B), and in the case where not A but only B is expressed in units, the unit of A is the same as that of B. Unless an atom ratio is not particularly limited when a compound or the like is represented by a chemical formula in this specification, the compound has any previously known atom ratio, and the atom ratio should not be limited only to one in a stoichiometric range.

Embodiment 1: Polycrystalline Diamond

The polycrystalline diamond according to the present embodiment is polycrystalline diamond having a diamond single phase as basic composition, in which the polycrystalline diamond includes a plurality of crystal grains; the polycrystalline diamond contains boron, hydrogen, oxygen, and the remainder including carbon and trace impurities; the boron is dispersed in the crystal grains at an atomic level, and greater than or equal to 90 atomic % of the boron is present in an isolated substitutional type; the hydrogen and the oxygen are present in an isolated substitutional type or an interstitial type in the crystal grains; each of the crystal grains has a grain size of less than or equal to 500 nm; and the polycrystalline diamond has a surface covered with a protective film.

Since the polycrystalline diamond according to present embodiment has a diamond single phase as basic composition, it does not contain a binding phase (binder) composed of both or one of a sintering aid and a catalyst, and grain dropping does not occur due to the difference in thermal expansion coefficient even under a high temperature condition. Further, since the polycrystalline diamond is a polycrystal formed of a plurality of crystal grains having a grain size of less than or equal to 500 nm, it does not have orientation and cleavage properties like a single crystal and has hardness and wear resistance that are isotropic in all directions. Since the polycrystalline diamond contains boron, hydrogen, and oxygen in the crystal grains, the surface thereof is covered with a protective film which is an oxide film. Accordingly, the oxidation resistance increases, and the dynamic friction coefficient is reduced, which in turn improves sliding properties and wear resistance.

In the polycrystalline diamond according to the present embodiment, from the viewpoint of having hardness and wear resistance that are isotropic in all directions, the maximum grain size of the crystal grains of the polycrystalline diamond is less than or equal to 500 nm, preferably less than or equal to 200 nm, and more preferably less than or equal to 100 nm. From the viewpoint of high hardness, the minimum grain size of the crystal grains of the polycrystalline diamond may be greater than or equal to 1 nm, and preferably greater than or equal to 20 nm.

The polycrystalline diamond having a grain size of less than or equal to 500 nm can obtain an effect of having isotropic hardness. Further, the polycrystalline diamond having a grain size of greater than or equal to 1 nm can obtain an effect of having mechanical strength specific to diamond. The polycrystalline diamond has more preferably a grain size of greater than or equal to 20 nm and less than or equal to 200 nm. In addition, it is more preferable that an aspect ratio of a major axis a to a minor axis b of each grain satisfies the relationship of a/b<4.

The grain size of the polycrystalline diamond can be measured by electron microscopy such as SEM or TEM. Any surface of the polycrystalline diamond is polished to prepare a polished surface for observation for the measurement of the grain size. Then, any one location (one visual field) on the polished surface for observation is observed, for example, using SEM at a magnification of 20000. Since approximately 120 to 200000 crystal grains of the polycrystalline diamond appear in one visual field, 10 of those crystal grains are measured to determine their grain sizes, and it is confirmed that all of them have a grain size of less than or equal to 500 nm.

Such measurement is performed on all of the visual fields in all sample sizes, and therefore, it can be confirmed that the polycrystalline diamond has a grain size of less than or equal to 500 nm.

The grain size of the polycrystalline diamond can also be measured by an X-ray diffraction method (XRD method) based on the following conditions.

Measuring apparatus: Trade name (product number) "X'pert", manufactured by PANalytical B.V.
X-ray light source: Cu-Kα ray (wave length: 1.54185 Å)
Scan axis: 2θ
Scan range: 2θ to 120°
Voltage: 40 kV
Current: 30 mA
Scan speed: 1°/min The half width was determined by the Scherrer's equation (D=Kλ/B cos θ) through peak fitting. Here, D is a crystal grain size of the diamond; B is a diffraction line width; λ is an X-ray wavelength; θ is a Bragg angle; K is a correction factor (0.9) determined by correlation with an SEM image.

<Elements in the Crystal Grains>

In the polycrystalline diamond according to the present embodiment, the boron is dispersed in the crystal grains at the atomic level, and greater than or equal to 90 atomic % of the boron is present in an isolated substitutional type; and the hydrogen and the oxygen are also present in an isolated substitutional type or an interstitial type in the crystal grains, so that the boron, the hydrogen, and the oxygen exposed on the surface of the polycrystalline diamond form an oxide film, and the oxide film covers the surface of the polycrystalline diamond as a protective film. Therefore, the oxidation resistance of the polycrystalline diamond increases and the coefficient of friction is reduced, which in turn improves sliding properties and wear resistance.

In the polycrystalline diamond according to the present embodiment, since the boron is dispersed at the atomic level and greater than or equal to 90 atomic % of the boron is present in an isolated substitutional type, a protective film which is an oxide film is formed only on the surface thereof when the surface thereof is damaged due to wear and/or breakage, and the diamond structure is maintained inside the polycrystalline diamond, so that the hardness is maintained. In addition, the boron is dispersed at the atomic level, and greater than or equal to 90 atomic % of the boron is present in an isolated substitutional type, the boron does not aggregate as clusters inside, and the boron also does not aggregate at a crystal grain boundary of diamond. Therefore, there is no segregation of impurities that could be a starting point of a crack due to temperature change and/or impact. In addition, since the boron is dispersed at the atomic level and greater than or equal to 90 atomic % of the boron is present in an isolated substitutional type, a protective film which is an oxide film localized on a desired exposed surface is formed over the entire polycrystalline diamond, and positive holes are excessively present as electric charge. Therefore, further oxygen is likely to be attracted to its surface only.

In the polycrystalline diamond according to the present embodiment, the "boron is dispersed at the atomic level" refers to a dispersed state at such a level that, when carbon and boron are mixed in a vapor phase state to thereby produce polycrystalline diamond, different elements such as boron are dispersed in the carbon that forms a crystal of the polycrystalline diamond, each element having a finite activation energy without changing the diamond crystal structure. That is, such a dispersed state refers to a state where a different element to be isolated and precipitated and a different compound other than diamond are not formed. In addition, the "isolated substitutional type" refers to an existence form in which different elements such as boron, hydrogen, and oxygen are isolated and substituted for carbon located at a lattice point of the polycrystalline diamond or graphite crystal lattice. The "interstitial type" refers to an existence form in which different elements such as hydrogen and oxygen are entered into spaces between carbons located at lattice points of the polycrystalline diamond crystal lattice.

The dispersed state and existence form of boron, hydrogen, and oxygen in the polycrystalline diamond according to the present embodiment can be observed with a transmission electron microscope (TEM). It can be confirmed by temperature dependence of electrical resistance, detection of activation energy, or a time-of-flight secondary ion mass spectrometry (TOF-SIMS) that the boron is "dispersed at the atomic level" and an "isolated substitutional type". The existence of the hydrogen and the oxygen in an "isolated substitutional type" or an "interstitial type" can be confirmed by TOF-SIMS.

With the TEM used for confirmation of the dispersed state and existence form as described above, the polished surface for observation for measuring the grain size of the polycrystalline diamond can be confirmed by observing any ten locations (ten visual fields) on the polished surface for observation at a magnification of 20000 to 100000.

Using TOF-SIMS, for example, analysis can be performed under the following conditions, so that it can be confirmed that each of the elements is "dispersed at the atomic level" and that each of the elements is an "isolated substitutional type" or an "interstitial type".

Measuring apparatus: Time-of-flight secondary ion mass spectrometer (TOF-SIMS)
Primary ion source: Bismuth (Bi)
Primary acceleration voltage: 25 kV The secondary ion mass spectrometry (SIMS) is used to measure concentrations of the boron, the hydrogen, and the oxygen inside the polycrystalline diamond, and the TOF-SIMS is used to measure those concentrations on the surface of the polycrystalline diamond and in the vicinity thereof (e.g., the oxide film as the protective film, and the polycrystalline diamond in the vicinity thereof, from the surface to a depth of 100 nm). Further, the dispersed state and the existence form as described above can be evaluated by X-ray diffraction (XRD), Raman spectroscopy, or the like. In addition, the concentration of the trace impurities formed of elements other than the carbon, the boron, the hydrogen, and the oxygen in the polycrystalline diamond according to the present embodiment is measured by SIMS or inductively coupled plasma-mass spectrometry (ICP-MS).

Using SIMS, for example, analysis can be performed under the following conditions, so that the atomic concentrations of the boron, the hydrogen, and the oxygen and the atomic concentration of the trace impurities inside the polycrystalline diamond can be measured.

Measuring apparatus: Trade name (product number): "IMS-7f", manufactured by AMETEK Inc.
Primary ion species: Cesium (Cs+)
Primary acceleration voltage: 15 kV
Detection area: 30 (μm φ)
Measurement accuracy: ±40% (2σ)

In the polycrystalline diamond according to the present embodiment, from the viewpoint of easily maintaining the high-hardness diamond structure inside the polycrystalline diamond, greater than or equal to 90 atomic/o of the boron is in an isolated substitutional type, preferably greater than or equal to 95 atomic % thereof is in an isolated substitutional type, and more preferably greater than or equal to 99 atomic % is in an isolated substitutional type. The ratio of the isolated substitutional boron to the total boron is determined by measuring the ratio of the number of boron atoms responsible for the Hall effect to the total number of boron atoms using SIMS in known hall measurement, measurement of temperature dependence of electrical resistance, and C-V measurement.

(Boron Atom Concentration)

In the polycrystalline diamond according to the present embodiment, from the viewpoint of suppressing increase of the crystal grain size to form a protective film which is a suitable oxide film on the surface thereof, the boron preferably has an atom concentration of greater than or equal to $1\times10^{14}$ cm$^{-3}$ and less than or equal to $1\times10^{22}$ cm$^{-3}$, and more preferably greater than or equal to $1\times10^{14}$ cm$^{-3}$ and less than or equal to $1\times10^{21}$ cm$^{-3}$. As compared with the preferable range, the more preferable range further suppresses the formation of a crystal grain having a grain size exceeding 500 nm, so that the yield is improved from greater than or equal to 30% to greater than or equal to 90%.

Within the boron concentration range described above, the polycrystalline diamond exhibits electrical properties as a p-type semiconductor in the range of less than $1\times10^{19}$ cm$^{-3}$ and exhibits electrical properties as a metallic conductor in the range of greater than or equal to $1\times10^{19}$ cm$^{-3}$.

(Hydrogen Atom Concentration)

In the polycrystalline diamond according to the present embodiment, from the viewpoint such that the oxygen can be stably contained in the crystal, and deterioration of hardness and increase of the crystal grain size can be suppressed, the hydrogen preferably has an atomic concentration of greater than or equal to $1\times10^{17}$ cm$^{-3}$ and less than or equal to $1\times10^{2}$ cm$^{-3}$, and more preferably greater than or equal to $1\times10^{17}$ cm$^{-3}$ and less than or equal to $1\times10^{19}$ cm$^{-3}$. However, even though the hardness is deteriorated, the polycrystalline diamond has higher hardness than a cubic boron nitride having a Knoop hardness of approximately 50 GPa and an industrial Ib-type diamond single crystal having a Knoop hardness of approximately 90 GPa. Therefore, the polycrystalline diamond is sufficiently useful for applications taking advantage of wear resistance properties (e.g., for wire drawing dies, for sliding parts, etc.). In the case where there is no hydrogen in the crystal, the oxygen reacts with the carbon in the polycrystalline diamond to produce a carbon oxide ($CO_X$) gas, and such a gas has a high temperature and is readily released, which makes it difficult to add oxygen into the crystal of the polycrystalline diamond.

(Oxygen Atom Concentration)

In the polycrystalline diamond according to the present embodiment, from the viewpoint such that the formation of the protective film, which is an oxide film, on the surface thereof is accelerated, so that oxidation resistance is improved, the coefficient of friction is reduced, and deterioration of hardness and increase of the crystal grain size can also be suppressed, the oxygen preferably has an atomic concentration of greater than or equal to $1\times10^{17}$ cm$^{-3}$ and less than or equal to $1\times10^{20}$ cm$^{-3}$, and more preferably greater than or equal to $1\times10^{18}$ cm$^{-3}$ and less than or equal to $1\times10^{19}$ cm$^{-3}$.

(Concentration of Trace Impurities)

The trace impurities contained in the polycrystalline diamond collectively refers to compounds which may be contained in trace amounts during manufacturing of the polycrystalline diamond. The content of each of the impurities contained as the trace impurities (each atomic concentration) is greater than or equal to 0 $cm^{-3}$ and less than or equal to $10^{16}$ $cm^{-3}$, and the total content of all the impurities contained as the trace impurities (total atomic concentration) is greater than or equal to 0 $cm^{-3}$ and less than or equal to $10^{17}$ $cm^{-3}$. Therefore, the trace impurities may or may not be contained in the polycrystalline diamond. The trace impurities include $B_4C$, $B_2O_3$, $B_3O_6$, and the like. The trace impurities other than these may include a compound containing a metal element categorized as a transition metal element, and the like.

(SIMS Measurement)

FIG. 1 is a graph showing an example of SIMS results of the polycrystalline diamond according to the present embodiment. The polycrystalline diamond shown in FIG. 1 is obtained by directly converting graphite to diamond under conditions of 16 GPa and 2100° C., the graphite being obtained by adding hydrogen and oxygen under a vacuum atmosphere of $1 \times 10^{-2}$ Pa to a graphite base material containing boron that has been formed by a chemical vapor deposition (CVD) method. The measurement conditions of SIMS are as follows.

Measuring apparatus: Trade name (product number): "IMS-7f", manufactured by AMETEK Inc.
Primary ion species: Cesium (Cs+)
Primary acceleration voltage: 15 kV
Detection area: 30 (μm φ)
Measurement accuracy: ±40% (2σ)

With reference to FIG. 1, the polycrystalline diamond according to the present embodiment contains the boron, the hydrogen, and the oxygen in uniform concentrations from the surface to the inside thereof.

(TOF-SIMS Measurement)

Figure 2:
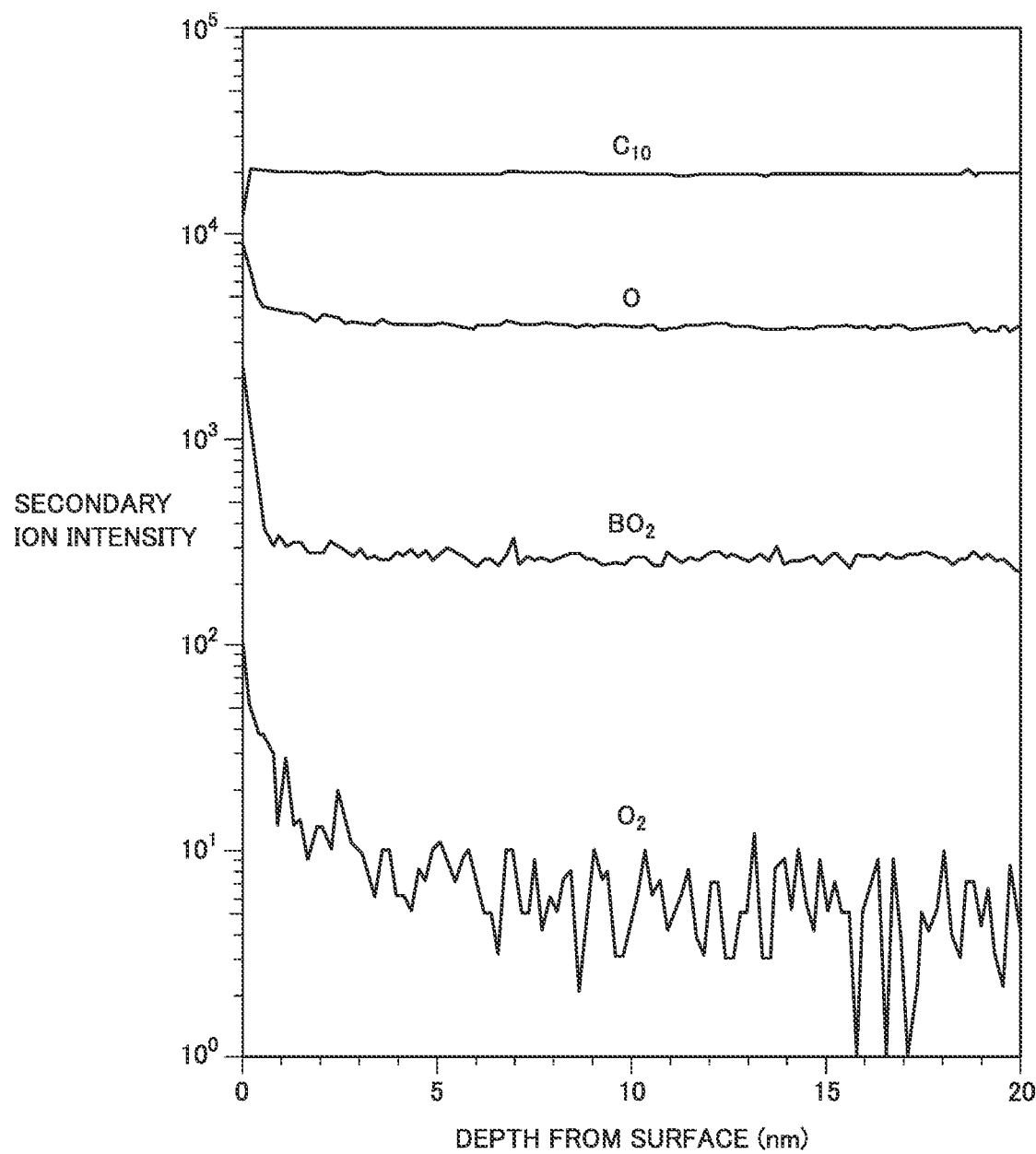
FIG. 2 is a graph showing TOF-SIMS results of a surface of polycrystalline diamond according to an aspect of the present invention.

FIG. 2 is a graph showing an example of TOF-SIMS results of a surface of the polycrystalline diamond according to the present embodiment. The polycrystalline diamond shown in FIG. 2 is polycrystalline diamond used in SIMS shown in FIG. 1. The measurement conditions of TOF-SIMS are as follows.

Measuring apparatus: Time-of-flight secondary ion mass spectrometer (TOF-SIMS)
Primary ion source: Bismuth (Bi)
Primary acceleration voltage: 25 kV With reference to FIG. 2, three chemical species of $BO_2$, O, and $O_2$ are detected as oxygen-containing species included in the oxide film as the protective film covering the surface of the polycrystalline diamond. Here, boron is detected as $BO_2$ in the oxide film. Therefore, it is considered that in the crystal inside the polycrystalline diamond, the boron is dispersed at the atomic level and most of the boron is present in the isolated substitutional type.

(Raman Spectroscopic Measurement)

In the Raman spectroscopic measurement of the polycrystalline diamond according to the present embodiment, the peak area around 1575 $cm^{-1} \pm 30$ $cm^{-1}$ with a half width of greater than 10 $cm^{-1}$ and less than or equal to 20 $cm^{-1}$ is preferably less than 1%, and more preferably less than 0.2%, of the peak area around 1300 $cm^{-1} \pm 30$ $cm^{-1}$ with a half width of less than or equal to 60 $cm^{-1}$. Since the peak area derived from amorphous carbon or graphite carbon (SP2 carbon) around 1575 $cm^{-1} \pm 30$ $cm^{-1}$ with a half width of greater than 10 $cm^{-1}$ and less than or equal to 20 $cm^{-1}$ is less than 1% of the peak area derived from diamond carbon (SP3 carbon) around 1300 $cm^{-1} \pm 30$ $cm^{-1}$ with a half width of less than or equal to 60 $cm^{-1}$, the graphite carbon is substantially completely (specifically, greater than or equal to 99 atomic %) converted to diamond carbon, so that the polycrystalline diamond has high hardness.

(Dynamic Friction Coefficient)

The surface (the surface covered with the protective film) of the polycrystalline diamond according to the present embodiment preferably has a dynamic friction coefficient of less than or equal to 0.06, more preferably less than or equal to 0.05, further preferably less than or equal to 0.04, particularly preferably less than or equal to 0.03, and most preferably less than or equal to 0.02. The polycrystalline diamond has high sliding properties and high wear resistance because the surface thereof has a low dynamic friction coefficient of less than or equal to 0.06.

(Protective Film)

In the polycrystalline diamond according to the present embodiment, the oxide film formed as the protective film that covers the surface thereof preferably contains a $BO_X$ cluster, and at least one of O and OH that are an oxygen end of the carbon. It is considered that the $BO_X$ cluster is obtained by allowing B (boron) exposed on the surface to react with oxygen in the air and oxygen in the crystal (oxygen in the crystal in vacuo or in an inert gas) and that O and OH that are an oxygen end of the carbon are obtained by allowing the carbon exposed on the surface to react with oxygen in the air and oxygen in the crystal grains (oxygen in the crystal grains in vacuo or in an inert gas). These elements have high slidability and a low coefficient of friction, so that wear resistance is improved.

With reference to FIG. 2, an example of TOF-SIMS results of the surface of the polycrystalline diamond according to the present embodiment shows that three chemical species of $BO_2$, O, and $O_2$ are present as oxygen-containing species included in the oxide film of the protective film. $BO_2$ is derived from the $BO_X$ cluster, and it is considered that the $BO_X$ cluster is present in the form of $BO_2$, $B_2O_4$, $B_3O_6$, and the like. It is considered that O and $O_2$ are derived from at least one of O and OH that are an oxygen end of the carbon.

In the polycrystalline diamond according to the present embodiment, the protective film preferably further contains a precipitate precipitated out of the crystal grains. In addition to the $BO_X$ cluster and at least one of O and OH that are an oxygen end of the carbon, the protective film further contains the precipitate having high slidability and a low coefficient of friction, so that the wear resistance of the polycrystalline diamond is improved. The precipitate is not particularly limited, and predominantly contains a boron oxide such as $B_2O_3$. It is considered that the $B_2O_3$ is formed by allowing B (boron) and $BO_2$ that are separated from the surface of the polycrystalline diamond to react with oxygen in the air and oxygen in the crystal (oxygen in the crystal in vacuo or in an inert gas). The precipitate also contributes to reduction in the coefficient of friction because it remains and is accumulated as debris (specifically, deposits formed of polishing chips) and has a lubricating action.

From the viewpoint such that even though the surface of the polycrystalline diamond according to the present embodiment is chipped due to mechanical damage to the polycrystalline diamond, the chipped portion is filled with the protective film in a portion other than the chipped portion, so that the polycrystalline diamond maintains a smooth surface, the protective film preferably has an average film thickness of greater than or equal to 1 nm and less than or equal to 1000 nm, and more preferably greater than or equal to 10 nm and less than or equal to 500 nm. Here, the average film thickness of the protective film can be measured by a stylus type surface shape measuring apparatus (e.g., Dektak (registered trademark) Stylus Profilometer, manufactured by the Bruker Corporation) and TEM.

Specifically, it is preferable that the polycrystalline diamond according to the present embodiment is polycrystalline diamond having a diamond single phase as basic composition, in which the polycrystalline diamond includes a plurality of crystal grains, the polycrystalline diamond contains boron, hydrogen, oxygen, and the remainder including carbon and trace impurities; the boron is dispersed in the crystal grains at the atomic level, and greater than or equal to 99 atomic % of the boron is present in an isolated substitutional type; the hydrogen and the oxygen are present in an isolated substitutional type or an interstitial type in the crystal grains; each of the crystal grains has a grain size of less than or equal to 500 nm; the polycrystalline diamond has a surface covered with a protective film; the boron has an atomic concentration of greater than or equal to $1 \times 10^{14}$ $cm^{-3}$ and less than or equal to $1 \times 10^{22}$ $cm^{-3}$; the hydrogen has an atomic concentration of greater than or equal to $1 \times 10^{17}$ $cm^{-3}$ and less than or equal to $1 \times 10^{20}$ $cm^{-3}$; the oxygen has an atomic concentration of greater than or equal to $1 \times 10^{17}$ $cm^{-3}$ and less than or equal to $1 \times 10^{20}$ $cm^{-3}$; in a Raman spectroscopic measurement of the polycrystalline diamond, a peak area around 1575 $cm^{-1} \pm 30$ $cm^{-1}$ with a half width of less than or equal to 20 $cm^{-1}$ is less than 1% of a peak area around 1300 $cm^{-1} \pm 30$ $cm^{-1}$ with a half width of less than or equal to 60 $cm^{-1}$; the surface (the surface covered with the protective film) of the polycrystalline diamond has a dynamic friction coefficient of less than or equal to 0.05; the protective film contains a $BO_X$ cluster, at least one of O and OH that are an oxygen end of the carbon, and a precipitate precipitated out of the crystal grains; and the protective film has an average film thickness of greater than or equal to 1 nm and less than or equal to 1000 nm. Since the polycrystalline diamond has the above-described characteristics, the oxidation resistance of the polycrystalline diamond increases and the coefficient of friction is reduced, which in turn improves sliding properties and wear resistance.

(Graphene Nanoribbon)

The polycrystalline diamond according to the present embodiment preferably contains a graphene nanoribbon. Accordingly, a graphene nanoribbon-derived protective film can be formed on the surface of the polycrystalline diamond. In this case, the polycrystalline diamond preferably has a peak at a Raman shift of 1554 $cm^{-1} \pm 20$ $cm^{-1}$ with a half width of less than or equal to 10 $cm^{-1}$ in the Raman spectroscopic measurement. Further, the polycrystalline diamond more preferably has a peak at a Raman shift of 2330 $cm^{-1} \pm 20$ $cm^{-1}$ with a half width of less than or equal to 6 $cm^{-1}$ in the Raman spectroscopic measurement Specifically, according to the present embodiment, polycrystalline diamond containing a graphene nanoribbon may be obtained depending on the conditions for the manufacturing method to be described later. In this case, the graphene nanoribbon is preferably present in close vicinity to the surface of the polycrystalline diamond.

Accordingly, when the graphene nanoribbon appears on the surface of the polycrystalline diamond, it reacts with oxygen in the air and oxygen in the crystal grains (oxygen in the crystal grains in vacuo or in an inert gas) to become an oxide, so that the graphene nanoribbon-derived protective film can be formed on the surface of the polycrystalline diamond. Since the graphene nanoribbon-derived protective film improves the sliding properties and reduces the dynamic friction coefficient, wear resistance can be improved. In particular, it can contribute to set the dynamic friction coefficient to less than or equal to 0.02. Further, even though the graphene nanoribbon-derived protective film is simultaneously present with the above-described $BO_X$ cluster that forms the other protective film on the surface of the polycrystalline diamond and any one of O and OH that are an oxygen end of the carbon, they are not interfered with one another, which may not affect their sliding properties.

Hereinafter, the confirmation and evaluation of the properties of the polycrystalline diamond according to the present embodiment will be described in detail by way of specific examples.

(Confirmation of Formation of Protective Film)

The surface of the polycrystalline diamond (boron concentration of $6.8 \times 10^{20}$ $cm^{-3}$, hydrogen concentration of $6.0 \times 10^{18}$ $cm^{-3}$, oxygen concentration of $3.0 \times 10^{18}$ $cm^{-3}$) according to the present embodiment is chemically analyzed by auger electron spectroscopy (AES), and oxygen is thereby detected in a surface layer from the surface to a depth of approximately 0.5 nm. This shows that an oxide film is formed as the protective film on the surface thereof even at room temperature (e.g., 25° C.)

Figure 3:
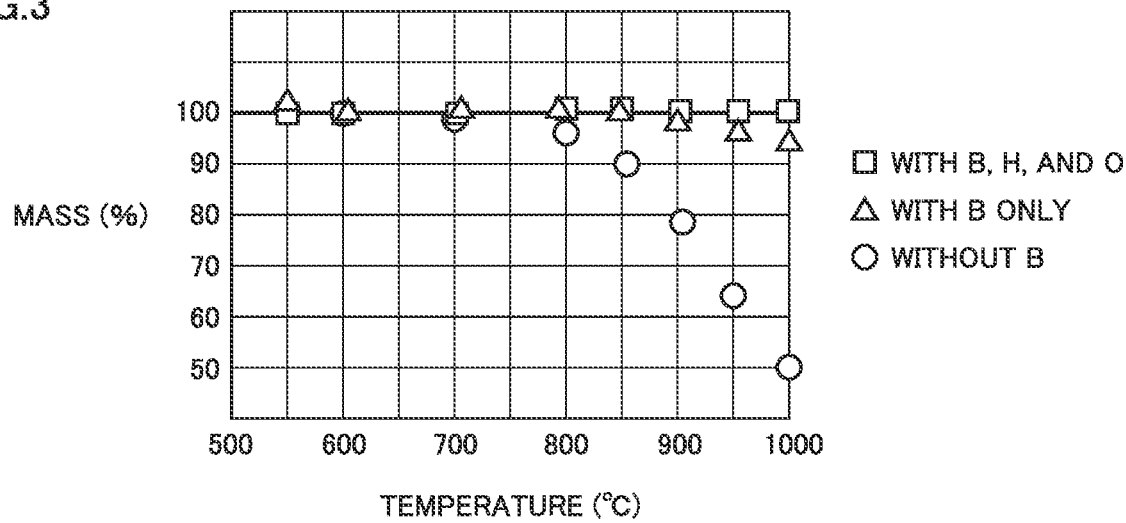
FIG. 3 is a graph showing an example of mass change of polycrystalline diamond according to an aspect of the present invention during heating in the air.

FIG. 3 is a graph showing an example of mass change of the polycrystalline diamond according to the present embodiment during heating in the air. With reference to FIG. 3, the polycrystalline diamond containing boron, hydrogen, and oxygen and the polycrystalline diamond containing boron alone slightly increases their masses until the temperature reaches approximately 800° C. This suggests that the formation of the protective film, which is an oxide film, on the surface thereof under high temperature is accelerated. Further, the mass of the polycrystalline diamond not containing boron is rapidly reduced at a temperature from approximately 800° C., and the mass of the polycrystalline diamond containing boron alone is gradually reduced at a temperature from approximately 800° C. In contrast to these, the reduction of the mass of the polycrystalline diamond containing boron, hydrogen, and oxygen is not observed until the temperature reaches approximately 1000° C. That is, in the polycrystalline diamond containing boron, hydrogen, and oxygen, it is considered that a stable oxide film is formed, and such a film is served as a protective film to improve the oxidation resistance of the polycrystalline diamond.

(Evaluation of Dynamic Friction Coefficient)

Figure 4:
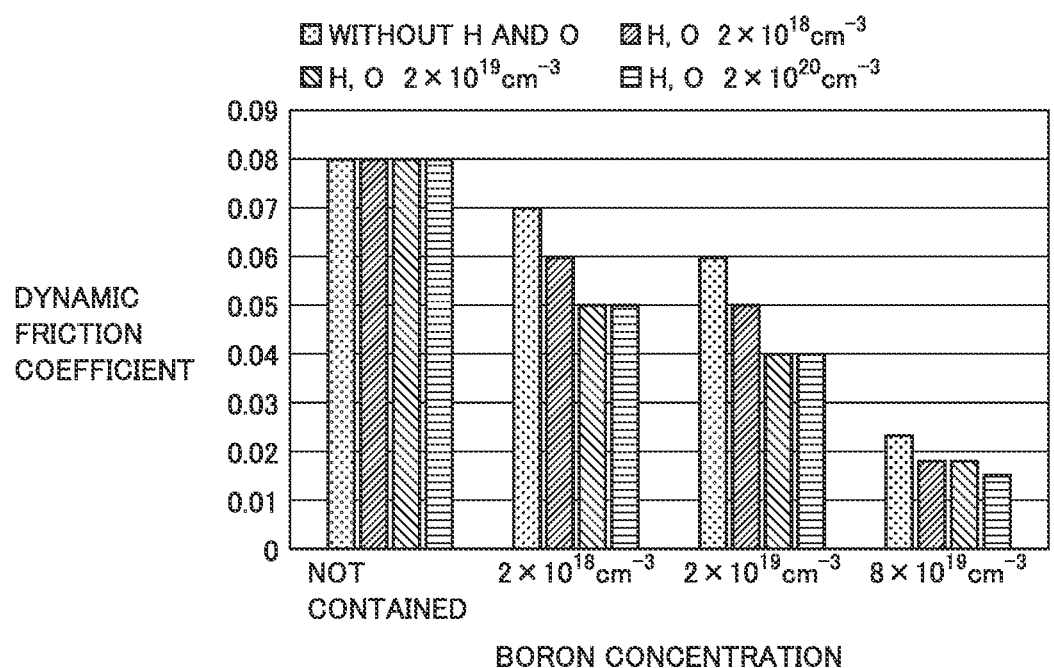
FIG. 4 is a graph showing an example of dynamic friction coefficient measurement results in a pin-on-disk sliding test of polycrystalline diamond according to an aspect of the present invention.

FIG. 4 is a graph showing an example of dynamic friction coefficient measurement results in a pin-on-disk sliding test of the polycrystalline diamond according to the present embodiment. The pin-on-disk sliding test is performed under the following conditions.

Material of ball: SUS
Load: 10 N
Number of revolutions: 400 rpm
Sliding radius: 1.25 mm
Test time: 100 minutes
Temperature: Room temperature
Atmosphere: Air (at 25° C. and 30% relative humidity)

With reference to FIG. 4, the dynamic friction coefficient of the polycrystalline diamond containing boron is reduced to less than or equal to 0.25 times, and the dynamic friction coefficient of the polycrystalline diamond containing boron, hydrogen, and oxygen is reduced to 0.20 times, as that of the polycrystalline diamond with no element added, under dry atmosphere (e.g., at 25° C., a relative humidity of less than or equal to 30%). Since the oxide film as the protective film formed on the surface of the polycrystalline diamond according to the present embodiment is water-soluble, it is preferably used in a dry-atmosphere environment. If used in the air, the oxide film preferably has less than or equal to the moisture content equivalent to a relative humidity of 30% at 25° C., and more preferably less than or equal to the moisture content equivalent to a relative humidity of 20% at 25° C. If used in atmosphere other than the air (e.g., argon (Ar) atmosphere or mineral oil atmosphere), the oxide film preferably has a water content of less than or equal to 25%, and more preferably a water content of less than or equal to 20%.

(Evaluation of Hardness)

Figure 5:
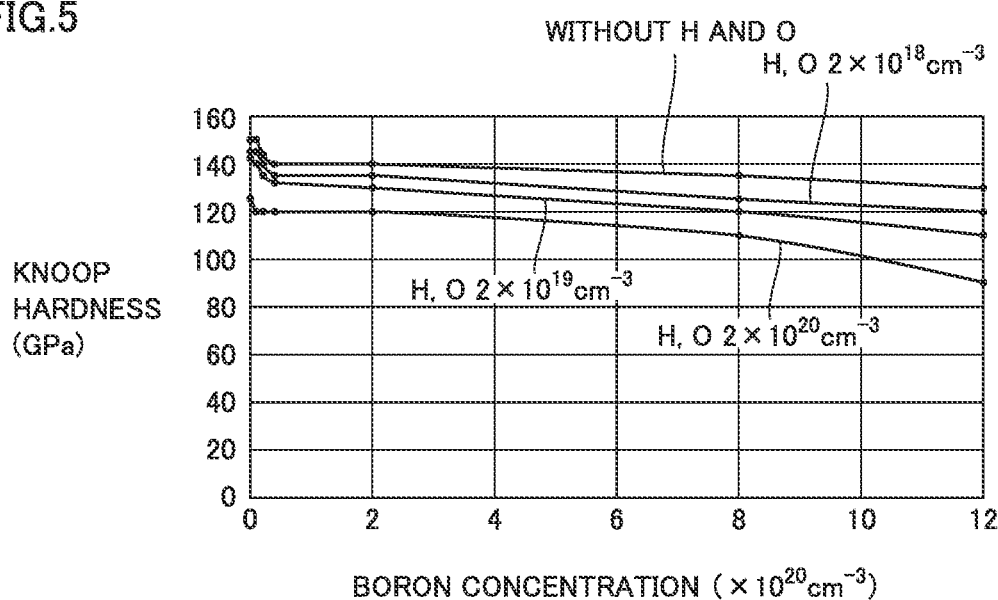
FIG. 5 is a graph showing an example of Knoop hardness measurement results of polycrystalline diamond according to an aspect of the present invention.

FIG. 5 is a graph showing an example of Knoop hardness measurement results of the polycrystalline diamond according to the present embodiment. The Knoop hardness is measured with a measurement load of 4.9 N in conformity with JIS Z2251:2009. With reference to FIG. 5, the Knoop hardness of the polycrystalline diamond containing boron somewhat decreases with an increase in the concentration of the boron, and the Knoop hardness of the polycrystalline diamond containing boron, hydrogen, and oxygen further somewhat decreases with an increase in the concentrations of the boron, hydrogen, and oxygen, as compared with the Knoop hardness of the polycrystalline diamond with no element added. It is considered that the boron, the hydrogen, and the oxygen contained in the polycrystalline diamond become starting points of plastic deformation and somewhat lower the hardness. However, the Knoop hardness of the polycrystalline diamond having a boron atom concentration of $4.0 \times 10^{20}$ cm$^{-3}$, a hydrogen atom concentration of $1.0 \times 10^{19}$ cm$^{-3}$, and an oxygen atom concentration of $1.0 \times 10^{19}$ cm$^{-3}$ is equivalent to or greater than the Knoop hardness of a normal synthetic single-crystal diamond (Ib-type single-crystal diamond, an isolated substitutional nitrogen concentration of $1.7 \times 10^{19}$ cm$^{-3}$).

(Evaluation of Wear Resistance)

According to the wear test (a load of 2.5 kgf/mm$^2$, a sliding rate of 200 mm/min) in which polycrystalline diamond is processed into a cylindrical shape having a diameter of φ 1 mm and a height of 2 mm, and a metal-bond diamond wheel #800 (manufactured by A.L.M.T. Corp.) is used, the wear rate of the polycrystalline diamond containing boron (atom concentration of $2.5 \times 10^{19}$ cm$^{-3}$ to $4.0 \times 10^{20}$ cm$^{-3}$), hydrogen (atom concentration of $2.2 \times 10^{18}$ cm$^{-3}$ to $3.5 \times 10^{19}$ cm$^{-3}$), and oxygen (atom concentration of $2.2 \times 10^{18}$ cm$^{-3}$ to $2.2 \times 10^{19}$ cm$^{-3}$) is from 2.5 to 3 mm$^3$/h, so that the wear resistance thereof is increased to 3 to 4 times as high as that of the polycrystalline diamond with no element added having a wear rate of 10 mm$^3$/h.

In the wear test using the metal bond diamond wheel, mechanical wear and thermochemical wear synergistically proceed. Then, mechanical wear properties and thermochemical wear properties are evaluated as shown below.

In order to evaluate the mechanical wear properties of polycrystalline diamond, a low-speed and long-time sliding test is performed with aluminum oxide (Al$_2$O$_3$) in which mechanical wear primarily proceeds. A frustoconical test piece having a φ 0.3-mm diameter test face at its tip end produced using polycrystalline diamond containing boron (atom concentration of 0 cm$^{-3}$ to $4.0 \times 10^{20}$ cm$^{-3}$), hydrogen (atom concentration of 0 cm$^{-3}$ to $4.0 \times 10^{19}$ cm$^{-3}$), and oxygen (atom concentration of 0 cm$^{-3}$ to $4.0 \times 10^{20}$ cm$^{-3}$) is used in a machining center, pressed against a sintered Al$_2$O$_3$ body (a purity of 99.9% by mass) under a constant load of 0.3 MPa, and slid at a low speed of 5 m/min for a distance of 10 km, and an amount of wear is calculated from the extent of the tip end diameter. The amount of wear of the polycrystalline diamond containing the boron, the hydrogen, and the oxygen is approximately 0.05 times as large as the polycrystalline diamond with no element added, so that the wear resistance is significantly improved. It is considered that the lubricating effect of a protective film, which is an oxide film, formed on the surface to be renewed by the wear of the polycrystalline diamond containing the boron, the hydrogen, and the oxygen contributes to significant improvement of the sliding properties, and mechanical wear is remarkably suppressed.

Figure 6:
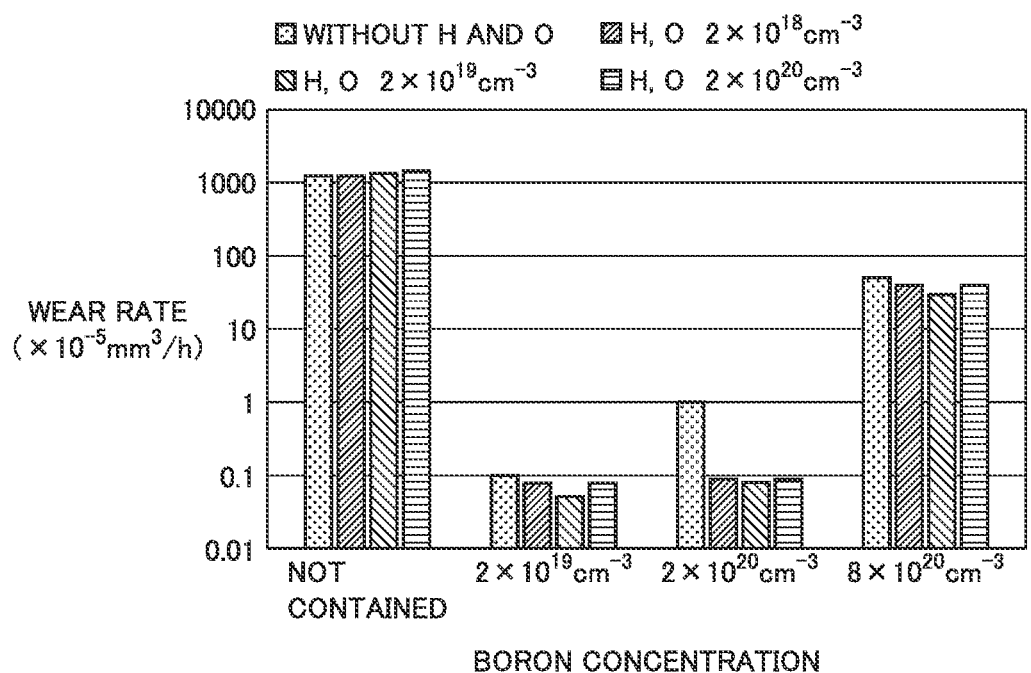
FIG. 6 is a graph showing an example of wear rate measurement results of polycrystalline diamond according to an aspect of the present invention against silicon dioxide.

In order to evaluate the thermochemical wear properties of the polycrystalline diamond, a sliding test is performed against silicon dioxide (SiO$_2$) in which thermochemical wear primarily proceeds. A frustoconical test piece having a φ 0.3-mm diameter test face at its tip end produced using polycrystalline diamond containing boron (atom concentration of 0 cm$^{-3}$ to $4.0 \times 10^{20}$ cm$^{-3}$), hydrogen (atom concentration of 0 cm$^{-3}$ to $4.0 \times 10^{19}$ cm$^{-3}$), and oxygen (atom concentration of 0 cm$^{-3}$ to $4.0 \times 10^{20}$ cm$^{-3}$) is secured, and while a φ 20-mm diameter synthetic quartz (SiO$_2$) is rotated at 6000 rpm (sliding speed of 260 to 340 m/min) as a grinder, it is pressed against the test face of the secured test piece with 0.1 MPa and then slid. FIG. 6 is a graph showing an example of wear rate measurement results of the polycrystalline diamond according to the present embodiment against silicon dioxide. As shown in FIG. 6, the wear rate of the polycrystalline diamond containing boron, hydrogen, and oxygen decreases as compared with that of the polycrystalline diamond with no element added, so that the wear resistance is improved. In particular, the wear rate of the polycrystalline diamond having a boron atom concentration of $2.0 \times 10^{19}$ cm$^{-3}$ to $2.0 \times 10^{20}$ cm$^{-3}$ greatly decreases, so that the wear resistance is significantly improved. Damage of the polycrystalline diamond by the silicon dioxide occurs due to wear caused by chemical reaction. It is, however, considered that the lubricating effect of a protective film, which is an oxide film, formed on the surface to be renewed by the wear of the polycrystalline diamond containing the boron, the hydrogen, and the oxygen contributes to significant improvement of the sliding properties, and thermochemical wear is remarkably suppressed.

The suppression of mechanical wear and the suppression of thermochemical wear due to suppression of heat generated by wearing in the polycrystalline diamond containing the boron, the hydrogen, and the oxygen are suitable for processing of a hard-to-cut material such as cemented carbide or aluminum alloy.

As described above, in the polycrystalline diamond according to the present embodiment, an oxide is formed on a surface thereof with the boron that is dispersed in the crystal grains at the atomic level and greater than or equal to 90 atomic % of which being present in an isolated substitutional type and the hydrogen and the oxygen that are present in an isolated substitutional type or an interstitial type in the crystal grains. The oxidation resistance, wear resistance, and sliding properties are improved by the oxidation resistance and lubricity of the protective film which is an oxide film.

Further, since the polycrystalline diamond according to the present embodiment has conductivity because of the contained boron, abnormal wear and tear caused by triboplasma, as seen in polycrystalline diamond with no element added, normal single-crystal diamond, and the like, is also suppressed. Therefore, it is expected that the polycrystalline diamond according to the present embodiment exhibits high performance for processing of an insulating object such as ceramics, plastics, glass, or quartz.

Embodiment 2: Method for Manufacturing Polycrystalline Diamond

Figure 7:
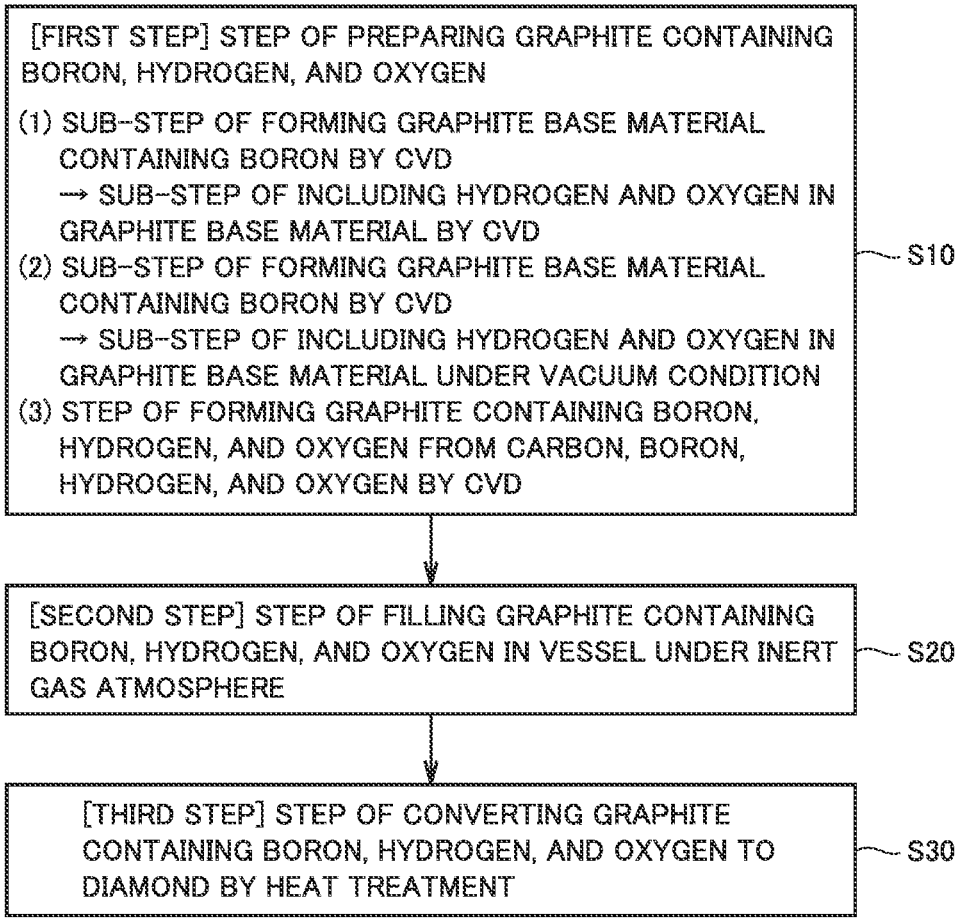
FIG. 7 is a flowchart showing steps in a method for manufacturing polycrystalline diamond according to another aspect of the present invention.

As shown in FIG. 7, the method for manufacturing polycrystalline diamond according to the present embodiment includes first step S10 of preparing graphite containing carbon, boron, hydrogen, and oxygen; second step S20 of placing the graphite in a vessel under an inert gas atmosphere; and third step S30 of converting the graphite to diamond by pressure heat treatment in the vessel, in which the boron is dispersed in a crystal grain of the graphite at an atomic level, and greater than or equal to 90 atomic % of the boron is present in an isolated substitutional type.

In the method for manufacturing polycrystalline diamond according to the present embodiment, since the graphite is directly converted to diamond, the polycrystalline diamond according to Embodiment 1 having high oxidation resistance, a low coefficient of friction, high sliding properties, and high wear resistance (i.e., polycrystalline diamond containing boron, hydrogen, and oxygen, in which the boron is dispersed in the crystal grains at the atomic level, and greater than or equal to 90 atomic % of the boron is present in an isolated substitutional type, and the hydrogen and the oxygen are present in an isolated substitutional type or an interstitial type in the crystal grains) can be manufactured.

In the method for manufacturing polycrystalline diamond according to the present embodiment, the "boron is dispersed at the atomic level" refers to a dispersed state at such a level that, when carbon and boron are mixed in a vapor phase state to thereby produce a graphite base material or the graphite, different elements such as boron are dispersed in the carbon that forms a crystal of the graphite base material or the graphite, each element having a finite activation energy without changing the crystal structure of the graphite base material or the graphite. That is, such dispersed state refers to a state where a different element to be isolated and precipitated and a different compound other than graphite base material or the graphite are not formed. In addition, the "isolated substitutional type" refers to an existence form in which different elements such as boron, hydrogen, and oxygen are isolated and substituted for carbon located at a lattice point of the graphite base material or graphite crystal lattice.

The dispersed state and existence form of boron in the graphite base material or boron, hydrogen, and oxygen in the graphite in the method for manufacturing polycrystalline diamond according to the present embodiment can be confirmed by the same method as that for confirming the dispersed state and existence form of these elements in the polycrystalline diamond. The "boron is dispersed at the atomic level", "isolated substitutional type" or "interstitial type", the concentrations of boron, nitrogen, and silicon, and the concentration of trace impurities can also be confirmed by the same method as that for confirming them in the polycrystalline diamond.

(First Step)

First step S10 in the method for manufacturing polycrystalline diamond according to the present embodiment is a step of preparing graphite containing carbon, boron, hydrogen, and oxygen, in which the boron is dispersed in the crystal grains at the atomic level, and greater than or equal to 90 atomic % of the boron is present in an isolated substitutional type. Such graphite is converted to diamond by pressure heat treatment, so that the polycrystalline diamond according to Embodiment 1 is obtained.

First step S10 is not particularly limited, and preferably includes a sub-step of forming a graphite base material containing carbon and boron on a base material by a vapor phase method, in which the boron is dispersed in a crystal grain of the graphite base material at the atomic level, and greater than or equal to 90 atomic % of the boron is present in an isolated substitutional type, from the viewpoint of efficiently producing the graphite with high quality. In the method for manufacturing polycrystalline diamond according to the present embodiment, the vapor phase method refers to a method for growing a crystal in vapor phase state, and though not particularly limited, a chemical vapor deposition (CVD) method is preferable from the viewpoint of efficiently producing the graphite with high quality. In CVD, a carbon-containing gas and a boron-containing gas are preferably allowed to react on the base material at a temperature of greater than or equal to 1500° C. and less than or equal to 2500° C.

When a method for forming a solid solution of boron in graphite with no element added is used in the sub-step of forming the graphite base material, it is necessary to use a non-graphite and non-diamond compound such as $B_4C$ to form a solid solution of boron in the graphite with no element added. Therefore, higher concentration of the carbon to be added requires higher concentration of the non-graphite and non-diamond compound such as $B_4C$, which decreases the bond strength of the polycrystalline diamond. In the method for manufacturing polycrystalline diamond according to the present embodiment, since the vapor phase method is used, the rate of $B_4C$ incorporated is less than 1% by mass, which is extremely low, so that high-quality polycrystalline diamond is obtained.

First step S10 is not particularly limited, and preferably includes a sub-step of including the hydrogen and the oxygen in the graphite base material by a vapor phase method, from the viewpoint of efficiently producing the graphite with high quality. The vapor phase method is not particularly limited, and a chemical vapor deposition (CVD) method is preferable from the viewpoint of efficiently producing the graphite with high quality. In CVD, a hydrogen-containing gas and an oxygen-containing gas are preferably allowed to react with the graphite base material at a temperature of greater than or equal to 1500° C. and less than or equal to 2500° C.

First step S10 is not particularly limited, and preferably further includes a sub-step of including the hydrogen and the oxygen in the graphite base material under vacuum condition, from the viewpoint of efficiently producing the graphite with high quality. Though not particularly limited, the vacuum condition is preferably less than or equal to 10 Pa, more preferably less than or equal to 1 Pa, and further preferably less than or equal to $10^{-2}$ Pa, from the viewpoint of reducing incorporation of trace impurities. In addition, the ambient temperature is preferably less than or equal to 600° C., and more preferably 300° C., from the viewpoint of suppressing oxidation of carbon. The method for including the hydrogen and the oxygen in the base material under vacuum condition is not particularly limited, and a hydrogen-containing gas and an oxygen-containing gas can be included in the graphite base material under vacuum condition.

Further, first step S10 is not particularly limited, and preferably includes a step of forming the graphite (specifically, graphite containing carbon, boron, hydrogen, and oxygen, in which the boron is dispersed in the crystal grain at the atomic level, and greater than or equal to 90 atomic % of the boron is present in an isolated substitutional type) on a base material by simultaneously mixing carbon, boron, hydrogen, and oxygen with one another in vapor phase by a vapor phase method, from the viewpoint of particularly efficiently producing the graphite with high quality. The vapor phase method is not particularly limited, and a chemical vapor deposition (CVD) method is preferable from the viewpoint of particularly efficiently producing the graphite with high quality. In CVD, a carbon-containing gas, a boron-containing gas, a hydrogen-containing gas, and an oxygen-containing gas are preferably allowed to react at a temperature of greater than or equal to 1500° C. and less than or equal to 2500° C.

When first step S10 includes the step of forming the graphite on a base material by simultaneously mixing the carbon, the boron, the hydrogen, and the oxygen with one another in vapor phase by a vapor phase method, it preferably includes a sub-step of forming a gas mixture containing the carbon, the boron, the hydrogen, and the oxygen; and a sub-step of forming the graphite on a base material by thermally decomposing the gas mixture at a temperature of greater than or equal to 1500° C. and feeding the gas mixture toward the base material, in which the gas mixture includes a gas containing the boron, the hydrogen, and the oxygen, and a hydrocarbon gas, from the viewpoint of particularly efficiently producing the graphite with high quality. After the gas mixture containing the carbon, the boron, the hydrogen, and the oxygen is formed, the graphite is formed from the gas mixture, so that the graphite with the boron, the hydrogen, and the oxygen more uniformly dispersed is obtained.

In first step S10 described above, first, a base material is heated to a temperature of greater than or equal to 1500° C. and less than or equal to 2500° C. in a vacuum chamber. Though not particularly limited, any metal, inorganic ceramic material, or carbon material can be used as the base material, so long as it is a material capable of withstanding a temperature approximately from 1500° C. to 2500° C.

Then, a gas containing boron, hydrogen, and oxygen, and a hydrocarbon gas are simultaneously introduced in the vacuum chamber under an atmosphere at a temperature of greater than or equal to 1500° C. and less than or equal to 2500° C. High temperature exceeding 2500° C. is not preferable because the hydrogen is released from the graphite to be formed, and because the oxygen and the carbon significantly react with each other to be volatilized as a carbon oxide gas. Here, when the gas containing boron, hydrogen, and oxygen, and the hydrocarbon gas are simultaneously introduced, from the viewpoint of more uniformly desperseing the boron, the hydrogen, and the oxygen in the graphite to be formed, to increase yield of polycrystalline diamond, it is preferable that the gas containing boron, hydrogen, and oxygen, and the hydrocarbon gas are previously mixed to produce a gas mixture, and the gas mixture is then introduced. For example, when the gas containing boron, hydrogen, and oxygen, and the hydrocarbon gas are injected from separate nozzles, the yield of the polycrystalline diamond is less than 20%. However, when the gas containing boron, hydrogen, and oxygen, and the hydrocarbon gas are mixed in a gas mixing chamber and the resulting gas mixture is injected from the same nozzle, the yield of the polycrystalline diamond is increased to greater than or equal to 80%.

The gas containing boron, hydrogen, and oxygen is not limited to one gas containing all these elements, and may be a gas mixture containing at least one of boron, hydrogen, and oxygen. As the one gas containing all these elements, trimethyl borate gas, triethyl borate gas, or the like is preferable.

The hydrocarbon gas is not particularly limited, and from the viewpoint of more uniform distribution of the boron, the hydrogen, the oxygen in the crystal of carbon, a hydrocarbon gas having a small number of carbon atoms is preferable; methane gas, ethane gas, ethylene gas, acetylene gas, and the like are preferable; and methane gas is particularly preferable.

The gas mixture is thermally decomposed at a temperature of greater than or equal to 1500° C. and less than or equal to 2500° C. and is fed toward the base material, so that the carbon, the boron, the hydrogen, and the oxygen formed in atomic form by the thermal decomposition are allowed to react with one another on the base material to thereby form the graphite on the base material.

The graphite is not particularly limited, and is a polycrystalline containing a crystallized portion in at least a portion thereof from the preferred viewpoint of formation of the polycrystalline diamond.

The concentration of the trace impurities in the graphite is preferably less than or equal to the detection limit of SIMS and/or ICP-MS, from the viewpoint of forming high-quality polycrystalline diamond with few trace impurities. From such a viewpoint also, the formation of the graphite by a vapor phase method, particularly, CVD is effective.

The grain size of the graphite is preferably less than or equal to 10 μm, and more preferably less than or equal to 1 μm, from the viewpoint of forming polycrystalline diamond having a small grain size of less than or equal to 500 nm and having uniform distribution of the boron, the hydrogen, and the oxygen. From such a viewpoint also, the formation of the graphite by a vapor phase method, particularly, CVD is effective.

The graphite has a density of preferably greater than or equal to 0.8 g/cm$^3$, and more preferably greater than or equal to 1.4 g/cm$^3$ and less than or equal to 2.0 g/cm$^3$, from the viewpoint of improving yield by making volume change smaller during the conversion from the graphite to the polycrystalline diamond in the third step.

(Second Step)

Second step S20 in the method for manufacturing polycrystalline diamond according to the present embodiment is a step of placing the graphite in a vessel under an inert gas atmosphere. Since the graphite is placed in a predetermined vessel under an inert gas atmosphere, it is possible to suppress incorporation of trace impurities into the graphite and the polycrystalline diamond to be formed. Here, the inert gas is not particularly limited as long as it can suppress incorporation of trace impurities into the graphite and the polycrystalline diamond to be formed, and examples thereof include argon (Ar) gas, krypton (Kr) gas, helium (He) gas, and the like.

(Third Step)

Third step S30 in the method for manufacturing polycrystalline diamond according to the present embodiment is a step of converting the graphite to diamond by pressure heat treatment in the vessel. In third step S30, when the graphite is converted to the polycrystalline diamond, it is preferable that the graphite is directly converted (specifically, converted without adding a sintering aid and/or a catalyst) by directly subjecting the graphite to heat treatment, from the viewpoint of suppressing incorporation of trace impurities into the polycrystalline diamond to be formed. The pressure heat treatment refers to heat treatment under pressure.

The pressure heat treatment in third step S30 is performed preferably under conditions of greater than or equal to 6 GPa and greater than or equal to 1200° C., and more preferably under conditions of greater than or equal to 8 GPa and less than or equal to 30 GPa, and greater than or equal to 1200° C. and less than or equal to 2300° C., from the viewpoint of suitably manufacturing polycrystalline diamond in which the boron is dispersed in the crystal grains of the polycrystalline diamond at the atomic level, greater than or equal to 90 atomic % of the boron is present in an isolated substitutional type, and the hydrogen and the oxygen are also present in an isolated substitutional type or an interstitial type in the crystal grains.

Here, in the case of performing the pressure heat treatment in third step S30 under conditions of about 7 to 15 GPa, the polycrystalline diamond tends to be manufactured containing a graphene nanoribbon. In this case, it can be confirmed that the polycrystalline diamond contains a graphene nanoribbon, by confirming at least one of the polycrystalline diamond having a peak at a Raman shift of 1554 $cm^{-1}\pm 20$ $cm^{-1}$ with a half width of less than or equal to 10 $cm^{-1}$ and the polycrystalline diamond having a peak at a Raman shift of 2330 $cm^{-1}\pm 20$ $cm^{-1}$ with a half width of less than or equal to 6 $cm^{-1}$, in the Raman spectroscopic measurement.

Specifically, according to the present embodiment, polycrystalline diamond containing a graphene nanoribbon may be obtained depending on the conditions for the manufacturing method as described above. In this case, a graphene nanoribbon-derived protective film is formed on the surface of the polycrystalline diamond, thereby improving the sliding properties and reducing the dynamic friction coefficient, so that wear resistance can be improved.

In view of the above, by the method for manufacturing polycrystalline diamond according to the present embodiment, polycrystalline diamond having high oxidation resistance, high sliding properties, high wear resistance, and a low dynamic friction coefficient can be manufactured. The polycrystalline diamond is manufactured in any shape and any thickness with a diameter of approximately 15×15 t (t: thickness). For example, in the case where the graphite has a volume density of approximately 1.8 $g/cm^3$, the volume of the polycrystalline diamond is shrunk to 70 to 80% of that of the graphite by pressure heat treatment, but the polycrystalline diamond has the same shape or substantially the same shape as the graphite.

Embodiment 3: Scribe Tool

The scribe tool according to the present embodiment can be formed using the polycrystalline diamond according to Embodiment 1. The scribe tool according to the present embodiment has high wear resistance because it is formed using the polycrystalline diamond according to Embodiment 1.

Embodiment 4: Scribe Wheel

The scribe wheel according to the present embodiment can be formed using the polycrystalline diamond according to Embodiment 1. The scribe wheel according to the present embodiment has high wear resistance because it is formed using the polycrystalline diamond according to Embodiment 1.

Embodiment 5: Dresser

The dresser according to the present embodiment can be formed using the polycrystalline diamond according to Embodiment 1. The dresser according to the present embodiment has high wear resistance because it is formed using the polycrystalline diamond according to Embodiment 1.

Embodiment 6: Rotating Tool

The rotating tool according to the present embodiment can be formed using the polycrystalline diamond according to Embodiment 1. The rotating tool according to the present embodiment has high wear resistance because it is formed using the polycrystalline diamond according to Embodiment 1.

Embodiment 7: Wire Drawing Die

The wire drawing die according to the present embodiment can be formed using the polycrystalline diamond according to Embodiment 1. The wire drawing die according to the present embodiment has high wear resistance because it is formed using the polycrystalline diamond according to Embodiment 1.

Embodiment 8: Cutting Tool

The cutting tool according to the present embodiment can be formed using the polycrystalline diamond according to Embodiment 1. The cutting tool according to the present embodiment has high wear resistance because it is formed using the polycrystalline diamond according to Embodiment 1.

Embodiment 9: Electrode

The electrode according to the present embodiment can be formed using the polycrystalline diamond according to Embodiment 1. The electrode according to the present embodiment has high wear resistance because it is formed using the polycrystalline diamond according to Embodiment 1.

Embodiment 10: Processing Method

In the processing method according to the present embodiment, an object can be processed using the polycrystalline diamond according to Embodiment 1. In the processing method according to the present embodiment, the object can be efficiently processed at low cost because it is processed using the polycrystalline diamond according to Embodiment 1.

In the processing method according to the present embodiment, the object is preferably an insulator. In the processing method according to the present embodiment, the object is processed using the polycrystalline diamond having conductivity according to the Embodiment 1. Therefore, even though the object is an insulator, it can be efficiently processed at low cost without generating abnormal wear and tear caused by triboplasma or the like.

In the processing method according to the present embodiment, the insulator as the object preferably has a resistivity of greater than or equal to 100 kΩ·cm. In the processing method according to the present embodiment, the object is processed using the polycrystalline diamond having conductivity according to Embodiment 1.

Therefore, even though the object is an insulator having a resistivity of greater than or equal to 100 kΩ·cm, the object can be efficiently processed at low cost without etching caused by triboplasma.

EXAMPLES

Example 1: Manufacturing of Polycrystalline Diamond

1. Preparation of Graphite Containing Boron, Hydrogen, and Oxygen

A degree of vacuum within a reaction vessel was reduced to less than or equal to $10^{-2}$ Pa, and the reaction vessel was thereafter filled with an inert gas (Ar gas) to create an atmosphere of 20 kPa. In the case of Examples 1 to 5, a gas mixture containing methane, trimethyl borate, oxygen, and hydrogen at a predetermined ratio was fed, and in the case of Comparative Examples 1 to 3, a gas mixture containing methane and trimethyl borate at a predetermined ratio was fed. Here, an inert gas was used to feed trimethyl borate. The gas mixture was allowed to react at an ambient temperature of 1500° C., so that graphite with 20 mm-thick containing boron, hydrogen, and oxygen was grown.

2. Housing of Graphite in Vessel

The graphite thus obtained was processed into a tablet form, and thereafter encapsulated with Ar gas in the vessel (cell for high-pressure press: cylindrical shape having a diameter of φ 10 mm and a height of 10 mm).

3. Conversion from Graphite to Polycrystalline Diamond

The vessel in which the graphite was encapsulated was placed in a pressure heat treatment apparatus, and then subjected to pressure heat treatment under conditions of 16 GPa and 2100° C., so that the graphite was directly converted to polycrystalline diamond. It was confirmed by X-ray diffraction (XRD) and electron diffraction (EBD) that each of the polycrystalline diamonds thus obtained in Comparative Examples 1 to 3 and Examples 1 to 5 had a diamond single phase as basic composition, did not contain a binding phase, and did not have a different phase made of $B_4C$ or the like. Further, for each of the polycrystalline diamonds of Comparative Examples 1 to 3 and Examples 1 to 5, it was confirmed by TEM, measurement of temperature dependence of electrical resistance, and TOF-SIMS that the boron was dispersed at the atomic level, and greater than or equal to 90 atomic % of the boron was present in an isolated substitutional type. Further, for each of the polycrystalline diamonds of Examples 1 to 5, it was confirmed by TEM, near edge X-ray absorption fine structure (NEXAFS), TOF-SIMS, measurement of temperature dependence of electrical resistance, and X-ray photoelectron spectroscopy (XPS) that the hydrogen and the oxygen were present in an isolated substitutional or interstitial type. Further, atomic concentrations of the boron, the hydrogen, the oxygen, and the trace impurities in each of the polycrystalline diamonds of Comparative Examples 1 to 3 and Examples 1 to 5 were measured by SIMS. In the polycrystalline diamonds of Comparative Examples 1 to 3 and Examples 1 to 5, the trace impurities were not detected.

The above results are summarized in Table 1. Here, in Table 1, the oxygen atom concentration was a detection limit of $1\times10^{16}$ cm$^{-3}$, and the hydrogen atom concentration was a detection limit of $1\times10^{17}$ cm$^{-3}$. Further, it was confirmed from the half width for the (111) peak with an X-ray diffractometer (XRD) that each of the polycrystalline diamonds of Comparative Examples 1 to 3 and Examples 1 to 5 had a crystal grain size of 30 to 60 nm.

TABLE 1

|  | Boron (cm$^{-3}$) | Oxygen (cm$^{-3}$) | Hydrogen (cm$^{-3}$) |
|---|---|---|---|
| Comparative Example 1 | $1 \times 10^{14}$ | Detection limit or less | Detection limit or less |
| Comparative Example 2 | $1 \times 10^{18}$ | Detection limit or less | Detection limit or less |
| Comparative Example 3 | $1 \times 10^{19}$ | Detection limit or less | Detection limit or less |
| Example 1 | $1 \times 10^{17}$ | $1 \times 10^{17}$ | $2 \times 10^{17}$ |
| Example 2 | $1 \times 10^{18}$ | $3 \times 10^{17}$ | $2 \times 10^{17}$ |
| Example 3 | $1 \times 10^{19}$ | $1 \times 10^{17}$ | $5 \times 10^{17}$ |
| Example 4 | $1 \times 10^{20}$ | $3 \times 10^{18}$ | $1 \times 10^{18}$ |
| Example 5 | $1 \times 10^{21}$ | $1 \times 10^{18}$ | $5 \times 10^{19}$ |

(Raman Spectroscopic Measurement)

Figure 8:
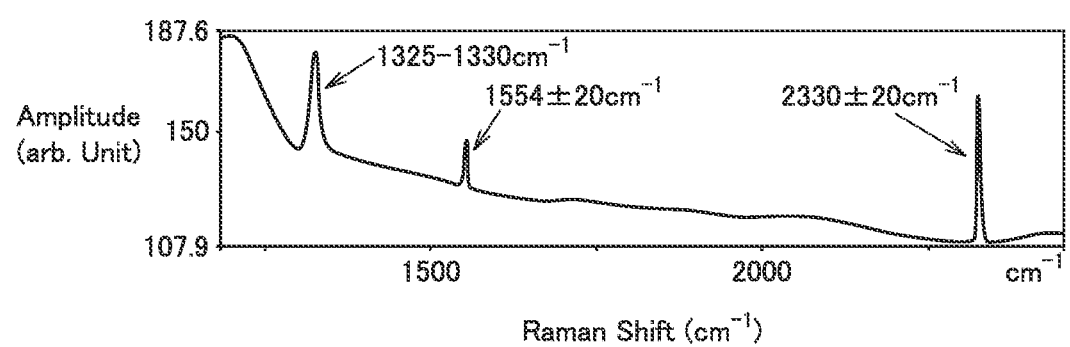
FIG. 8 is a spectrum showing that in the Raman spectroscopic measurement of the polycrystalline diamond in Example 1, peaks of a graphene nanoribbon appear at a Raman shift of $1554 \pm 20$ cm$^{-1}$ with a half width within 10 cm$^{-1}$ and at a Raman shift of $2330 \pm 20$ cm$^{-1}$ with a half width within 6 cm$^{-1}$.

The Raman spectroscopic measurement was performed for the polycrystalline diamonds of Comparative Example 1, Example 1, and Example 2 as described above, using a Raman spectrophotometer (trade name: Raman microscope "RAMANtouch", manufactured by Nanophoton). The conditions for the measurement are as follows. Wavenumber measurement range: From 1200 to 1700 cm$^{-1}$ (532 nm excitation) Resolution: Spectral resolution 0.36 cm$^{-1}$ Further, the dynamic friction coefficients of these polycrystalline diamonds were determined by the above-described measurement method (pin-on-disk sliding test). These measurement results (shift (peak) position and line width (half width), presence or absence of graphene nanoribbon, dynamic friction coefficient) are shown in Table 2. Further, the Raman spectrum obtained for the polycrystalline diamond of Example 1 is shown in FIG. 8. According to FIG. 8, it is understood that the polycrystalline diamond of Example 1 contains a graphene nanoribbon because peaks of the graphene nanoribbon appear at a Raman shift of 1554±20 cm$^{-1}$ with a half width less than or equal to 10 cm$^{-1}$ and at a Raman shift of 2330±20 cm$^{-1}$ with a half width less than or equal to 6 cm$^{-1}$. Further, Table 2 showed that each of the polycrystalline diamonds of Examples 1 and 2 contained a graphene nanoribbon, so that their dynamic friction coefficients were an order of magnitude lower than that of the polycrystalline diamond of Comparative Example 1.

TABLE 2

|  |  | 1554 ± 20 (cm$^{-1}$) | | 2330 ± 20 (cm$^{-1}$) | | |
|---|---|---|---|---|---|---|
|  | Presence/absence of nanoribbon | Shirt (peak) | Line width (half width) | Shirt (peak) | Line width (half width) | Coefficient of friction |
| Comparative Example 1 | Absence |  |  |  |  | 0.2 |
| Example 1 | Presence | 1554.1 | 6.13 | 2328.1 | 3.64 | 0.02 |
| Example 2 | Presence | 1553.2 | 7.0 | 2327.2 | 3.7 | 0.02 |

Example II: Production and Evaluation of Scribe Tool

The polycrystalline diamond of Comparative Example 2 according to Example I was used to produce a scribe tool having four points at a tip end (having a quadrangular two-dimensional shape). The produced scribe tool was used to form 200 scribe grooves each having a length of 50 nm in a sapphire substrate at a load of 20 gf. Thereafter, an amount of wear of the polycrystalline diamond at the tip end portion of the scribe tool was observed with an electron microscope. Then, the amount of wear of the scribe tool was 0.2 times that were small, as compared with that of the scribe tool made of Ib-type single-crystal diamond. Further, when the polycrystalline diamond of Example 2 according to Example I was used to produce a scribe tool in the same manner as above and the same experiment was conducted, the amount of wear of the scribe tool was 0.02 times that were extremely small, as compared with that of the scribe tool made of Ib-type single-crystal diamond, and was 0.1 times that were extremely small, as compared with that of the scribe tool made of the polycrystalline diamond of Comparative Example 2. The same effect was observed in the scribe wheel produced by using each of the polycrystalline diamonds of Comparative Example 2 and Example 2 according to Example I.

Example III: Production and Evaluation of Dresser

The polycrystalline diamond of Comparative Example 2 according to Example I was used to produce a dresser having a single point at a tip end (having a conical shape). The produced dresser was worn with a wet method by using a white alumina (WA) grindstone under such conditions as a peripheral speed of the grindstone of 30 m/sec. and a depth of cut of 0.05 mm. Thereafter, an amount of wear of the dresser was measured with a height gauge, and the amount of wear of the polycrystalline diamond was 0.3 times that were small, as compared with that of the dresser made of Ib-type single-crystal diamond. Further, when the polycrystalline diamond of Comparative Example 2 according to Example I was used to produce a dresser in the same manner as above and the same experiment was conducted, the amount of wear of the dresser was 0.03 times that were extremely small, as compared with that of the dresser made of Ib-type single-crystal diamond, and was 0.1 times that were extremely small, as compared with that of the dresser made of the polycrystalline diamond of Comparative Example 2.

Example IV: Production and Evaluation of Rotating Tool

The polycrystalline diamond in Comparative Example 2 according to Example I was used to produce a drill having a diameter of φ1 mm and a blade length of 3 mm. The produced drill was used to drill a hole through a 1.0 mm-thick plate made of cemented carbide (WC—Co plate) (composition: 12% by mass of Co, the remainder was WC) under such conditions as a number of revolutions of 4000 rpm and a feed rate of 2 μm/rev. The number of holes that could be drilled until the drill was worn or broken was 5 times that were large, as compared with that of a drill made of Ib-type single-crystal diamond. Further, when the polycrystalline diamond of Example 2 according to Example I was used to produce a drill in the same manner as above and a similar experiment was conducted, the number of holes that could be drilled until the drill was worn or broken was 50 times that were extremely large, as compared with that of the drill made of Ib-type single-crystal diamond, and was 10 times that were extremely large, as compared with the dresser made of the polycrystalline diamond of Comparative Example 2.

Example V: Production and Evaluation of Cutting Tool I

The same method as in Examples 1 to 5 according to Example I was used to prepare graphite having a bulk density of 2.0 g/cm$^{-3}$, a boron atom concentration of $1\times10^{21}$ cm$^{-3}$ measured by ICP-MS, and an oxygen atom concentration of $1\times10^{18}$ s cm$^{-3}$ and a hydrogen atom concentration of $2.5\times10^{18}$ cm$^{-3}$ measured by SIMS. Such graphite was directly converted to polycrystalline diamond by pressure heat treatment under conditions of 15 GPa and 2200° C. using an isotropic high pressure generator. The resulting polycrystalline diamond had a grain size of 10 nm to 100 nm. No precipitation of $B_4C$ was observed in X-ray patterns.

The polycrystalline diamond thus obtained was used to fabricate a main body of a cutting tool by a conventional known method. The polycrystalline diamond was joined to the main body of the cutting tool with the use of an active brazing material in an inert atmosphere. After a surface of the polycrystalline diamond was polished, a flank face was cut with electric discharge machining, to thereby produce an R cutting tool (testing tool 1) having a corner R of 0.4 mm, a relief angle of 11°, and a rake angle of 0°. For comparison, a tool (comparative tool A) made of sintered diamond containing a conventional cobalt (Co) binder was similarly produced through electric discharge machining. Accuracy of a ridge line of a cutting edge made through electric discharge machining in comparative tool A made of sintered diamond was approximately from 2 μm to 5 μm depending on the grain size of contained diamond abrasive grains. Accuracy of a ridge line of a cutting edge made through electric discharge machining in the tool (testing tool 1) made of the polycrystalline diamond was less than or equal to 0.5 μm, which was good. In addition, the processing time was also the same as comparative tool A.

Further, an R cutting tool (testing tool 2) having a corner R of 0.4 mm, a relief angle of 11°, and a rake angle of 0°, which was processed by polishing its flank face; a cutting tool (comparative tool B) made of polycrystalline diamond with no element added; and a cutting tool (comparative tool C) made of Ib-type single-crystal diamond were produced, and cutting was evaluated with the test contents as shown in the following paragraph. In both testing tool 2 and comparative tool B, accuracy of a ridge line of a cutting edge was less than or equal to 0.1 μm and minute accuracy of a cutting edge was obtained.

Next, with testing tools 1 and 2, and comparative tools A to C, an intermittent cutting evaluation test was performed by turning under the following conditions.

Shape of tool: Corner R of 0.4 mm, a relief angle of 11°, and a rake angle of 0°
Work material: Material—aluminum alloy A390
Cutting fluid: Water-soluble emulsion
Cutting condition: Cutting speed Vc=800 m/min, depth of cut ap=0.2 mm, feed rate f=0.1 mm/rev.
Cutting distance: 10 km After the cutting evaluation test as described above was performed, the cutting edge of the tool was observed, and a state of wear and tear was checked. Then, in comparative tool A, an amount of wear of a flank face was as great as 45

μm, and a shape of the cutting edge was lost, whereas in testing tool 1, an amount of wear of a flank face was 2 μm, which was satisfactory. On the other hand, testing tool 2 in which finishing with polishing was performed had an amount of wear of 0.5 μm, and it was much better than comparative tool B having an amount of wear of 3.5 m and comparative tool C having an amount of wear of 3.5 μm. It was found that testing tool 2 exhibited wear resistance properties equal to or higher than conventional polycrystalline diamond with no element added, and it was excellent in tool life.

Example VI: Production and Evaluation of Cutting Tool II

The same method as in Examples 1 to 5 according to Example I was used, except that a gas mixture containing trimethylboron, methane, hydrogen, and oxygen was introduced, so that graphite having a bulk density of 2.0 g/cm$^{-3}$, a boron atom concentration of $1\times10^{18}$ cm$^{-3}$, an oxygen atom concentration of $1\times10^{18}$ cm$^{-3}$, and a hydrogen atom concentration of $2.5\times10^{18}$ cm$^{-3}$ measured by SIMS was prepared.

Such graphite was directly converted to polycrystalline diamond by pressure heat treatment under conditions of 15 GPa and 2200° C. using an isotropic high pressure generator. The polycrystalline diamond had a grain size of 10 nm to 100 nm. No precipitation of $B_4C$ was observed in X-ray patterns.

The polycrystalline diamond was joined to a main body of a cutting tool with the use of an active brazing material in an inert atmosphere, and the surface of the polycrystalline diamond was polished. Further, a tool (testing tool 3) made of the polycrystalline diamond of which a flank face was processed by polishing, a tool (comparative tool B) made of polycrystalline diamond with no element added, and a tool (comparative tool C) made of Ib-type single-crystal diamond were produced, and cutting was evaluated with the same contents as in Example V.

After the cutting evaluation test as described above was performed, the cutting edge of the tool was observed, and a state of wear and tear was checked. Then, testing tool 3 having an amount of wear of 0.1 μm was much smaller and better than comparative tool B having an amount of wear of 3.5 μm and comparative tool C having an amount of wear of 3.5 μm. It was found that testing tool 3 exhibited wear resistance properties equal to or higher than conventional polycrystalline diamond with no element added, and it was excellent in tool life.

Example VII: Production and Evaluation of Cutting Tool III

A gas mixture containing diborane, methane, hydrogen, and oxygen was introduced in a reaction vessel, and graphite was fabricated while the degree of vacuum in the chamber was kept constant at 26.7 kPa. Thereafter, the degree of vacuum was reduced to less than or equal to $10^{-2}$ Pa, the ambient temperature was cooled to 300° C., and a gas mixture containing hydrogen and oxygen was further introduced to the graphite at 1 standard cubic centimeter per minute (sccm). Thus, graphite having a bulk density of 1.9 g/cm$^{-3}$, a boron atom concentration of $1\times10^{2}$: cm$^{-3}$, an oxygen atom concentration of $1\times10^{18}$ cm$^{-1}$, and a hydrogen atom concentration of $2.5\times10^{19}$ cm$^{-3}$ measured under the same conditions as in Example I by SIMS was prepared. Such graphite was directly converted to polycrystalline diamond by pressure heat treatment under conditions of 15 GPa and 2200° C. using a high pressure generator. The resulting polycrystalline diamond had a grain size of 10 nm to 100 nm. This polycrystalline diamond had a Knoop hardness of 120 GPa. A test piece having a size of 3 mm×1 mm square was cut from the polycrystalline diamond and electrical resistance of the test piece was measured, and it was 10Ω.

The polycrystalline diamond having conductivity was joined to a main body of a cutting tool with the use of an active brazing material in an inert atmosphere, and the surface of the polycrystalline diamond was polished. A flank face was cut with electric discharge machining, to thereby produce a ball end mill (testing tool 4) having a diameter of φ 0.5 mm with two twisted cutting blades. For comparison, a tool (comparative tool A-2) made of sintered diamond containing a conventional cobalt (Co) binder was similarly produced through electric discharge machining. Accuracy of a ridge line of a cutting edge made through electric discharge machining was approximately from 2 μm to 5 μm, depending on the grain size of contained diamond abrasive grains in comparative tool A-2 made of sintered diamond, and was less than or equal to 0.03 μm in the tool (testing tool 4) made of the polycrystalline diamond, which was good. In addition, polycrystalline diamond with no element added was used to produce an end mill shape having the same shape with laser machining, and then a tool (comparative tool B-2) of which a flank face was locally polished to finish a cutting edge grade was produced.

Next, with testing tool 4, and comparative tools A-2 and B-2, an intermittent cutting evaluation test was performed by turning under the following conditions.
Shape of tool: φ 0.5 mm double-bladed ball end mill
Work material: Material—STAVAX cemented carbide (composition: 12% by mass of Co, the remainder was WC)
Cutting fluid: Kerosene
Cutting condition: Tool revolution speed of 420000 rpm, depth of cut ap=0.003 mm, feed rate f=120 mm/rev When the cutting evaluation test was performed, the tool life of testing tool 4 was 5 times as long as that of comparative tool A-2 and 1.5 times as long as that of comparative tool B-2, which was very good.

The embodiment and examples disclosed herein are merely an exemplification in every respect and should not be considered as limitative. The scope of the present invention is given by claims rather than the above-described embodiments and examples, and intended to include meanings equivalent to claims, and all changes within the scope of claims.

REFERENCE SIGNS LIST

S10: First step, S20: Second step, S30: Third step

The invention claimed is:

1. Polycrystalline diamond having a diamond single phase as basic composition, wherein
the polycrystalline diamond includes a plurality of crystal grains,
the polycrystalline diamond contains boron, hydrogen, oxygen, and a remainder containing carbon and trace impurities,
the boron is dispersed in the crystal grains at an atomic level, and greater than or equal to 90 atomic % of the boron is present in an isolated substitutional type, the hydrogen and the oxygen are present in an isolated substitutional type or an interstitial type in the crystal grains, each of the crystal grains has a grain size of less than or equal to 500 nm, and the polycrystalline diamond has a surface covered with a protective film, wherein the protective film is a graphene nanoribbon film.

2. The polycrystalline diamond according to claim 1, wherein greater than or equal to 99 atomic % of the boron is present in an isolated substitutional type in the crystal grains.

3. The polycrystalline diamond according to claim 1, wherein the boron has an atomic concentration of greater than or equal to $1\times10^{14}$ cm$^{-3}$ and less than or equal to $1\times10^{22}$ cm$^{-3}$.

4. The polycrystalline diamond according to claim 1, wherein the hydrogen has an atomic concentration of greater than or equal to $1\times10^{17}$ cm$^{-3}$ and less than or equal to $1\times10^{20}$ cm$^{-3}$.

5. The polycrystalline diamond according to claim 1, wherein the oxygen has an atomic concentration of greater than or equal to $1\times10^{17}$ cm$^{-3}$ and less than or equal to $1\times10^{20}$ cm$^{-3}$.

6. The polycrystalline diamond according to claim 1, wherein in a Raman spectroscopic measurement of the polycrystalline diamond, a peak area around 1575 cm$^{-1}$±30 cm$^{-1}$ with a half width of greater than 10 cm$^{-1}$ and less than or equal to 20 cm$^{-1}$ is less than 1% of a peak area around 1300 cm$^{-1}$±30 cm$^{-1}$ with a half width of less than or equal to 60 cm$^{-1}$.

7. The polycrystalline diamond according to claim 1, wherein the surface of the polycrystalline diamond has a dynamic friction coefficient of less than or equal to 0.06.

8. The polycrystalline diamond according to claim 1, wherein the surface of the polycrystalline diamond has a dynamic friction coefficient of less than or equal to 0.05.

9. The polycrystalline diamond according to claim 1, wherein the protective film contains a BO$_X$ cluster, and at least one of O and OH that are an oxygen end of the carbon.

10. The polycrystalline diamond according to claim 9, wherein the protective film contains a precipitate precipitated out of the crystal grains.

11. The polycrystalline diamond according to claim 1, wherein the protective film has an average film thickness of greater than or equal to 1 nm and less than or equal to 1000 nm.

12. The polycrystalline diamond according to claim 1, wherein the polycrystalline diamond has a peak at a Raman shift of 1554 cm-1±20 cm-1 with a half width of less than or equal to 10 cm-1 in the Raman spectroscopic measurement.

13. The polycrystalline diamond according to claim 1, wherein the polycrystalline diamond has a peak at a Raman shift of 1554 cm$^{-1}$±20 cm$^{-1}$ with a half width of less than or equal to 10 cm$^{-1}$ in the Raman spectroscopic measurement.

14. A scribe tool formed using the polycrystalline diamond according to claim 1.

15. A scribe wheel formed using the polycrystalline diamond according to claim 1.

16. A dresser formed using the polycrystalline diamond according to claim 1.

17. A rotating tool formed using the polycrystalline diamond according to claim 1.

18. A wire drawing die formed using the polycrystalline diamond according to claim 1.

19. A cutting tool formed using the polycrystalline diamond according to claim 1.

20. A electrode formed using the polycrystalline diamond according to claim 1.

21. A processing method comprising processing an object using the polycrystalline diamond according to claim 1.

22. The processing method according to claim 21, wherein the object is an insulator.

23. The processing method according to claim 22, wherein the insulator has a resistivity of greater than or equal to 100 kΩ·cm.

24. Polycrystalline diamond having a diamond single phase as basic composition, wherein the polycrystalline diamond includes a plurality of crystal grains, the polycrystalline diamond contains boron, hydrogen, oxygen, and a remainder containing carbon and trace impurities, the boron is dispersed in the crystal grains at an atomic level, and greater than or equal to 90 atomic % of the boron is present in an isolated substitutional type, the hydrogen and the oxygen are present in an isolated substitutional type or an interstitial type in the crystal grains, each of the crystal grain has a grain size of less than or equal to 500 nm, the polycrystalline diamond has a surface covered with a protective film, the boron has an atomic concentration of greater than or equal to $1\times10^{14}$ cm$^{-3}$ and less than or equal to $1\times10^{22}$ cm$^{-3}$, the hydrogen has an atomic concentration of greater than or equal to $1\times10^{17}$ cm$^{-3}$ and less than or equal to $1\times10^{20}$ cm$^{-3}$, the oxygen has an atomic concentration of greater than or equal to $1\times10^{17}$ cm$^{-3}$ and less than or equal to $1\times10^{20}$ cm$^{-3}$, in a Raman spectroscopic measurement of the polycrystalline diamond, a peak area around 1575 cm$^{-1}$±30 cm$^{-1}$ with a half width of greater than 10 cm$^{-1}$ and less than or equal to 20 cm$^{-1}$ is less than 1% of a peak area around 1300 cm$^{-1}$±30 cm$^{-1}$ with a half width of less than or equal to 60 cm$^{-1}$, the surface of the polycrystalline diamond has a dynamic friction coefficient of less than or equal to 0.05, the protective film contains a BO$_X$ cluster, at least one of O and OH that are an oxygen end of the carbon, and a precipitate precipitated out of the crystal grains, the protective film has an average film thickness of greater than or equal to 1 nm and less than or equal to 1000 nm, the polycrystalline diamond contains a graphene nanoribbon, the polycrystalline diamond has a peak at a Raman shift of 1554 cm$^{-1}$±20 cm$^{-1}$ with a half width of less than or equal to 10 cm$^{-1}$ in the Raman spectroscopic measurement, and the polycrystalline diamond has a peak at a Raman shift of 2330 cm$^{-1}$±20 cm$^{-1}$ with a half width of less than or equal to 6 cm$^{-1}$ in the Raman spectroscopic measurement, and wherein the protective film is a graphene nanoribbon.

25. A method for manufacturing the polycrystalline diamond of claim 1, the method comprising a first step of preparing graphite containing carbon, boron, hydrogen, and oxygen;

a second step of placing the graphite in a vessel under an inert gas atmosphere;

and a third step of converting the graphite to diamond by pressure heat treatment in the vessel, wherein the boron is dispersed in a crystal grain of the graphite at an atomic level, and greater than or equal to 90 atomic % of the boron is present in an isolated substitutional type.

26. The method for manufacturing polycrystalline diamond according to claim 25, wherein the first step includes a sub-step of forming a graphite base material containing carbon and boron on a base material by a vapor phase method, and the boron is dispersed in a crystal grain of the graphite base material at an atomic level, and greater than or equal to 90 atomic % of the boron is present in an isolated substitutional type.

27. The method for manufacturing polycrystalline diamond according to claim 26, wherein the first step further includes a sub-step of including the hydrogen and the oxygen in the graphite base material by a vapor phase method.

28. The method for manufacturing polycrystalline diamond according to claim 26, wherein the first step further includes a sub-step of including the hydrogen and the oxygen in the graphite base material under vacuum condition.

29. The method for manufacturing polycrystalline diamond according to claim 25, wherein the first step includes a step of forming the graphite on a base material by simultaneously mixing the carbon, the boron, the hydrogen, and the oxygen with one another in vapor phase by a vapor phase method.

30. The method for manufacturing polycrystalline diamond according to claim 29, wherein the first step includes a sub-step of forming a gas mixture containing the carbon, the boron, the hydrogen, and the oxygen, and a sub-step of forming the graphite on the base material by thermally decomposing the gas mixture at a temperature of greater than or equal to 1500° C. and feeding the gas mixture toward the base material, and the gas mixture includes a gas containing the boron, the hydrogen, and the oxygen, and a hydrocarbon gas.

31. The method for manufacturing polycrystalline diamond according to claim 30, wherein the hydrocarbon gas is a methane gas.

32. The method for manufacturing polycrystalline diamond according to claim 25, wherein in the third step, the graphite is directly subjected to pressure heat treatment in a pressure heat treatment apparatus.

33. The method for manufacturing polycrystalline diamond according to claim 25, wherein the pressure heat treatment is performed under conditions of greater than or equal to 6 GPa and greater than or equal to 1200° C.

34. The method for manufacturing polycrystalline diamond according to claim 25, wherein the pressure heat treatment is performed under conditions of greater than or equal to 8 GPa and less than or equal to 30 GPa, and greater than or equal to 1200° C. and less than or equal to 2300° C.

* * * * *